US012002799B2

(12) United States Patent
Yu et al.

(10) Patent No.: US 12,002,799 B2
(45) Date of Patent: Jun. 4, 2024

(54) DIE STACKING STRUCTURE AND METHOD FORMING SAME

(71) Applicant: Taiwan Semiconductor Manufacturing Co., Ltd., Hsinchu (TW)

(72) Inventors: Chen-Hua Yu, Hsinchu (TW); Hung-Yi Kuo, Taipei (TW); Chung-Shi Liu, Hsinchu (TW); Hao-Yi Tsai, Hsinchu (TW); Cheng-Chieh Hsieh, Tainan (TW); Tsung-Yuan Yu, Taipei (TW); Ming Hung Tseng, Toufen Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/814,766

(22) Filed: Jul. 25, 2022

(65) Prior Publication Data

US 2022/0359488 A1    Nov. 10, 2022

Related U.S. Application Data

(62) Division of application No. 16/925,032, filed on Jul. 9, 2020, now Pat. No. 11,521,959.

(Continued)

(51) Int. Cl.
*H01L 23/498* (2006.01)
*H01L 21/56* (2006.01)
(Continued)

(52) U.S. Cl.
CPC ............ *H01L 25/50* (2013.01); *H01L 21/561* (2013.01); *H01L 21/563* (2013.01);
(Continued)

(58) Field of Classification Search
CPC ............ H01L 23/3128; H01L 25/0657; H01L 2224/97; H01L 21/563; H01L 2924/181
See application file for complete search history.

(56) References Cited

U.S. PATENT DOCUMENTS 7,843,042 B2    11/2010   Kuan et al.
8,987,057 B2    3/2015    Van Gemert
(Continued)

FOREIGN PATENT DOCUMENTS

CN    103824783 A    5/2014
CN    104900597 A    9/2015
(Continued)

*Primary Examiner* — Anthony Ho
*Assistant Examiner* — David J Goodwin
(74) *Attorney, Agent, or Firm* — Slater Matsil, LLP

(57) ABSTRACT

A method includes bonding a first device die to a second device die, encapsulating the first device die in a first encapsulant, performing a backside grinding process on the second device die to reveal through-vias in the second device die, and forming first electrical connectors on the second device die to form a package. The package includes the first device die and the second device die. The method further includes encapsulating the first package in a second encapsulant, and forming an interconnect structure overlapping the first package and the second encapsulant. The interconnect structure comprises second electrical connectors.

20 Claims, 28 Drawing Sheets

Related U.S. Application Data

(60) Provisional application No. 62/988,506, filed on Mar. 12, 2020.

(51) Int. Cl.
*H01L 21/66* (2006.01)
*H01L 21/768* (2006.01)
*H01L 23/00* (2006.01)
*H01L 25/00* (2006.01)
*H01L 25/065* (2023.01)
*H01L 25/18* (2023.01)

(52) U.S. Cl.
CPC ........ *H01L 21/76898* (2013.01); *H01L 22/14* (2013.01); *H01L 22/32* (2013.01); *H01L 24/03* (2013.01); *H01L 24/16* (2013.01); *H01L 24/17* (2013.01); *H01L 24/81* (2013.01); *H01L 25/0657* (2013.01); *H01L 25/18* (2013.01); *H01L 2224/0231* (2013.01); *H01L 2224/02331* (2013.01); *H01L 2224/02379* (2013.01); *H01L 2224/13024* (2013.01); *H01L 2224/16145* (2013.01); *H01L 2224/17181* (2013.01); *H01L 2225/06513* (2013.01); *H01L 2225/06541* (2013.01)

(56) References Cited

U.S. PATENT DOCUMENTS

| | | |
|---|---|---|
| 9,293,442 B2 | 3/2016 | Su |
| 10,014,218 B1 | 7/2018 | Shih et al. |
| 10,529,690 B2 | 1/2020 | Shih et al. |
| 10,535,633 B2 | 1/2020 | Wei et al. |
| 10,867,874 B2 | 12/2020 | Yu |
| 11,037,910 B2 | 6/2021 | Yoo et al. |
| 11,456,240 B2 | 9/2022 | Yu |
| 2008/0315372 A1 | 12/2008 | Kuan et al. |
| 2009/0200662 A1* | 8/2009 | Ng .................. H01L 23/3135 |
| | | 257/E23.116 |
| 2012/0282735 A1 | 11/2012 | Ahn et al. |
| 2014/0217604 A1 | 8/2014 | Chou et al. |
| 2015/0061139 A1 | 3/2015 | Yap |
| 2018/0269188 A1* | 9/2018 | Yu .................. H01L 23/3128 |
| 2018/0315737 A1 | 11/2018 | Meyer et al. |
| 2019/0244947 A1* | 8/2019 | Yu .................. H01L 24/92 |
| 2020/0035606 A1 | 1/2020 | Bhagavat et al. |

FOREIGN PATENT DOCUMENTS

| | | |
|---|---|---|
| CN | 108122880 A | 6/2018 |
| CN | 110137151 A | 8/2019 |
| KR | 101522425 B1 | 5/2015 |
| TW | 201921625 A | 6/2019 |

* cited by examiner

DIE STACKING STRUCTURE AND METHOD FORMING SAME

PRIORITY CLAIM AND CROSS-REFERENCE

This application is a divisional of U.S. patent application Ser. No. 16/925,032, entitled "Die Stacking Structure and Method Forming Same," and filed Jul. 9, 2020, which claims the benefit of the U.S. Provisional Application No. 62/988,506, entitled "A Novel Die Stacking Structure for Chiplet Integration," and filed on Mar. 12, 2020, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
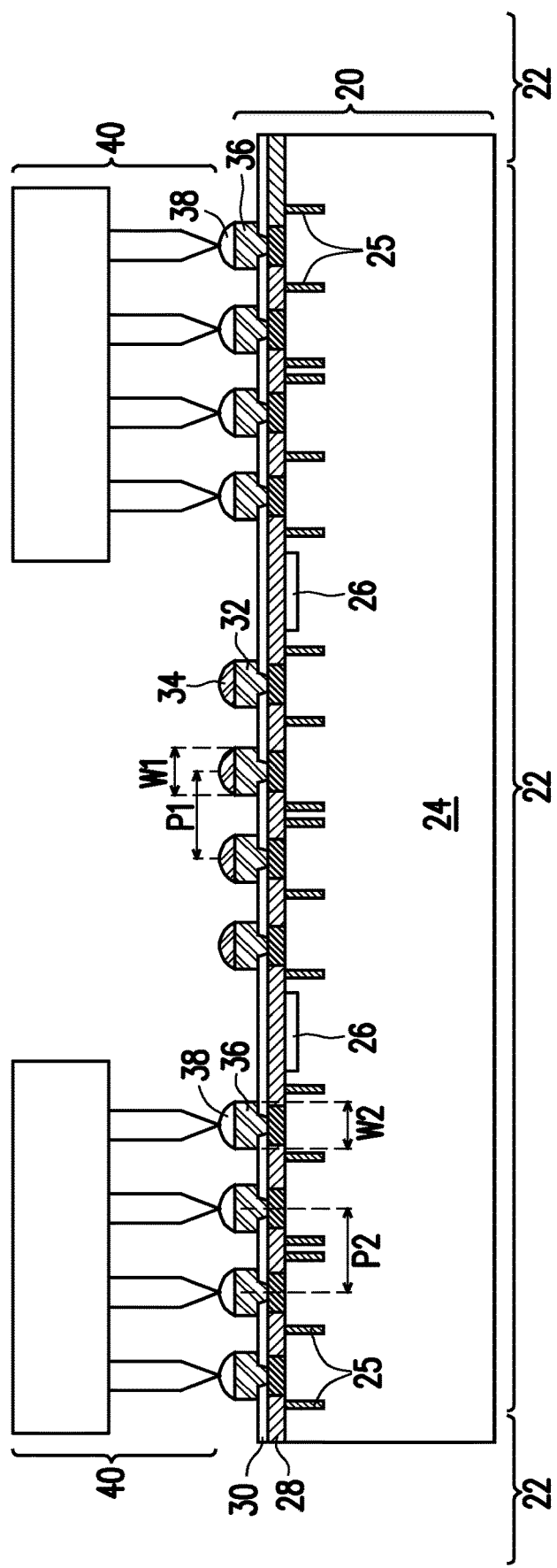
FIGS. 1-9, 10A, 10B, 11-14, 15A, 16A, 15B, 16B, and 17-20 illustrate the cross-sectional views of intermediate stages in the formation of a die stack in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A die stack and the processes of forming the die stack are provided in accordance with some embodiments. In accordance with some embodiments of the present disclosure, the die stack includes a first device die bonded to a second device die, with both of the first device die and the second device die including integrated circuit devices (such as transistors) therein. The second device die includes through-vias (sometime referred to as Through-Substrate Vias or Through-Silicon Vias (TSVs)). Redistribution lines may be formed on the die stack using a fan-out process, so that the redistribution lines are physically joined to the second device die without solder regions therebetween. Probe pads may be formed on the surface of the second device die, and may be in contact with an encapsulant that encapsulates the first device die therein. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 25:
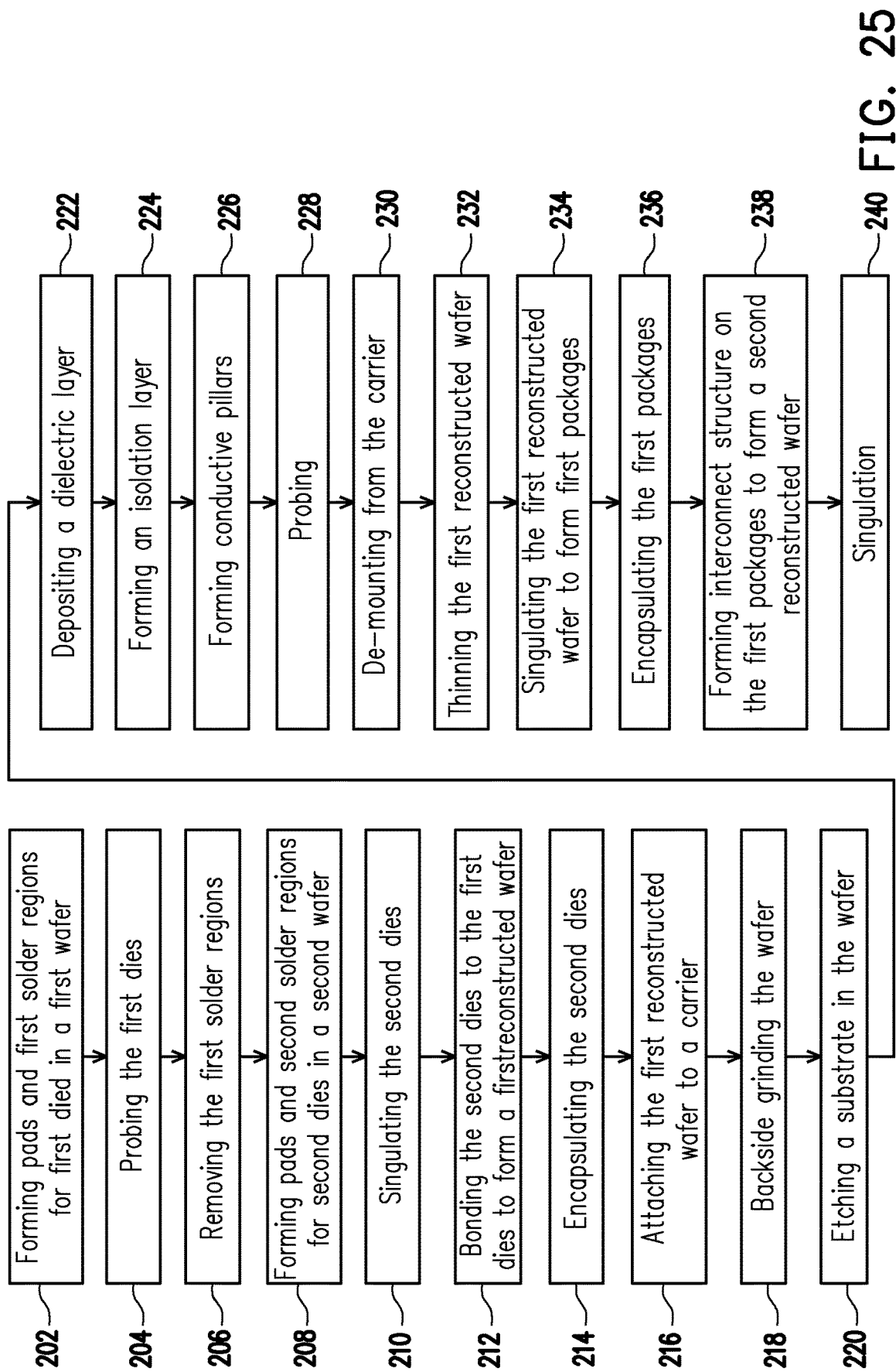
FIG. 25 illustrates a process flow for forming a die stack in accordance with some embodiments.

FIGS. 1-9, 10A, 10B, 11-14, 15A, 16A, 15B, 16B, and 17-20 illustrate the cross-sectional views of intermediate stages in the formation of a die stack in accordance with some embodiments of the present disclosure. The corresponding processes are reflected schematically in the process flow 200 as shown in FIG. 25.

FIG. 1 illustrates a cross-sectional view of wafer 20. Wafer 20 may include a plurality of device dies 22 therein, with one of the device dies 22 illustrated as an example. The plurality of device dies 22 are identical to each other. In accordance with some embodiments of the present disclosure, wafer 20 is a device wafer including active devices and possibly passive devices, which are illustrated as integrated circuit devices 26. In accordance with some embodiments, device dies 22 are logic dies, which may be Application Specific Integrated Circuit (ASIC) dies, Field Programmable Gate Array (FPGA) dies, or the like. For example, device dies 22 may be Central Processing Unit (CPU) dies, Graphic Processing Unit (GPU) dies, or the like.

In accordance with some embodiments of the present disclosure, device die 22 includes semiconductor substrate 24. Semiconductor substrate 24 may be formed of crystalline silicon, crystalline germanium, silicon germanium, or a III-V compound semiconductor such as GaN, GaAsP, AlInAs, AlGaAs, GaInAs, GaInP, GaInAsP, or the like. Semiconductor substrate 24 may also be a bulk semiconductor substrate or a Semiconductor-On-Insulator (SOI) substrate. Shallow Trench Isolation (STI) regions (not shown) may be formed in semiconductor substrate 24 to isolate the active regions in semiconductor substrate 24.

Through-vias (sometimes referred to as through-silicon vias or through-semiconductor vias) 25 are formed to extend into semiconductor substrate 24, wherein through-vias 25 are used to electrically inter-couple the features on the opposite sides of device die 22. Through-vias 25 are electrically connected to the overlying bond pads 32, and may be electrically connected to probe pads 36.

In accordance with some embodiments of the present disclosure, integrated circuit devices 26 may include Complementary Metal-Oxide Semiconductor (CMOS) transistors, resistors, capacitors, diodes, and the like. Some of integrated circuit devices 26 may be formed at a top surface of semiconductor substrate 24. The details of integrated circuit devices 26 are not illustrated herein.

Interconnect structure 28 is formed over semiconductor substrate 24. The details of interconnect structure 28 are not shown, and are discussed briefly herein. In accordance with some embodiments, interconnect structure 28 includes an Inter-Layer Dielectric (ILD) over semiconductor substrate 24 and filling the space between the gate stacks of transistors (not shown) in integrated circuit devices 26. In accordance with some embodiments, the ILD is formed of Phospho Silicate Glass (PSG), Boro Silicate Glass (BSG), Boron-doped Phospho Silicate Glass (BPSG), Fluorine-doped Silicate Glass (FSG), silicon oxide, or the like. In accordance with some embodiments of the present disclosure, the ILD is formed using a deposition method such as Plasma-Enhanced Chemical Vapor Deposition (PECVD), Low Pressure Chemical Vapor Deposition (LPCVD), spin-on coating, Flowable Chemical Vapor Deposition (FCVD), or the like.

Contact plugs (not shown) are formed in the ILD, and are used to electrically connect integrated circuit devices 26 and through-vias 25 to overlying metal lines and vias. In accordance with some embodiments of the present disclosure, the contact plugs are formed of a conductive material selected from tungsten, aluminum, copper, titanium, tantalum, titanium nitride, tantalum nitride, alloys thereof, and/or multi-layers thereof. The formation of the contact plugs may include forming contact openings in the ILD, filling a conductive material(s) into the contact openings, and performing a planarization process (such as a Chemical Mechanical Polish (CMP) process or a mechanical grinding process) to level the top surfaces of the contact plugs with the top surface of the ILD.

Interconnect structure 28 may further include a plurality of dielectric layers (not shown) over the ILD and the contact plugs. Metal lines and vias (not shown) are formed in the dielectric layers (also referred to as Inter-Metal Dielectrics (IMDs)). The metal lines at a same level are collectively referred to as a metal layer hereinafter. In accordance with some embodiments of the present disclosure, interconnect structure 28 includes a plurality of metal layers, each including a plurality of metal lines at the same level. The metal lines in neighboring metal layers are interconnected through the vias. The metal lines and vias may be formed of copper or copper alloys, and they can also be formed of other metals. In accordance with some embodiments of the present disclosure, the IMDs are formed of low-k dielectric materials. The dielectric constants (k values) of the low-k dielectric materials may be lower than about 3.0, for example. The dielectric layers may comprise a carbon-containing low-k dielectric material, Hydrogen SilsesQuioxane (HSQ), MethylSilsesQuioxane (MSQ), or the like. In accordance with some embodiments of the present disclosure, the formation of the dielectric layers includes depositing a porogen-containing dielectric material and then performing a curing process to drive out the porogen, and hence the remaining dielectric layers are porous. Surface dielectric layer 30 is formed over interconnect structure 28. In accordance with some embodiments, surface dielectric layer 30 is formed of a polymer, which may include polybenzoxazole (PBO), polyimide, benzocyclobutene (BCB), or the like.

Figure 4:
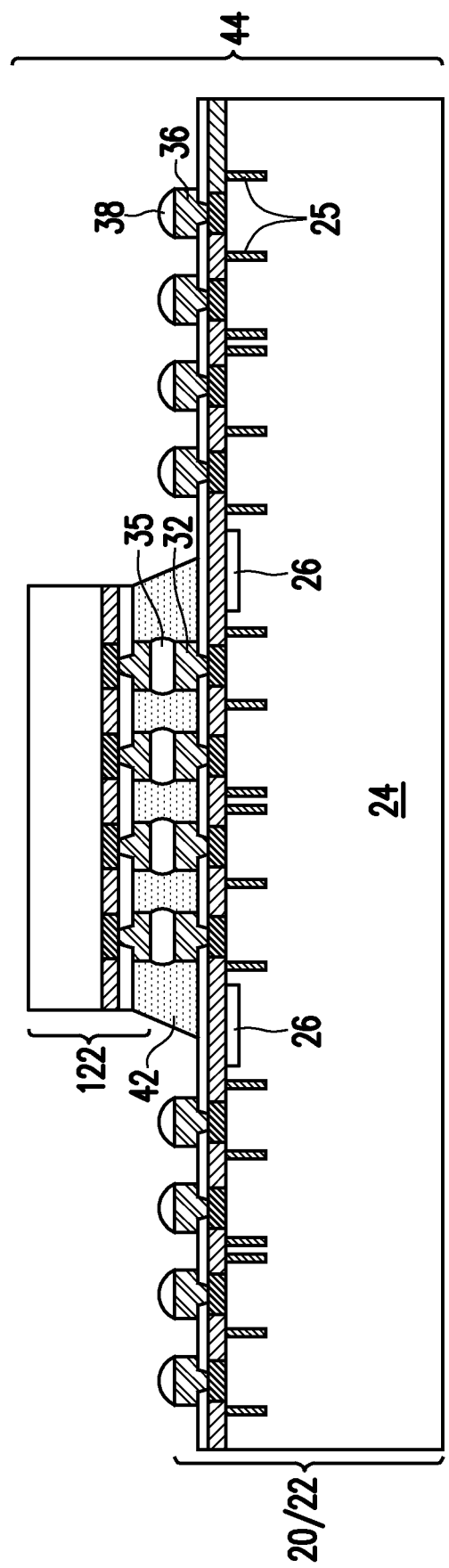

Bond pads 32 and probe pads 36 are formed on the top surface of device die 22. The respective process is illustrated as process 202 in the process flow 200 as shown in FIG. 25. In accordance with some embodiments, both of bond pads 32 and probe pads 36 are electrically and signally connected to integrated circuit devices 26, and possibly to through-vias 25. In accordance with some embodiments, bond pads 32 are micro-bumps having lateral dimension W1 and pitch P1, and probe pads 36 have lateral dimension W2 and pitch P2. The lateral dimension W2 may be greater than (or may be equal to) lateral dimension W1. Pitch P2 may be greater than (or may be equal to) pitch P1. In accordance with some embodiments, probe pads 36 are used for probing (testing the function of) integrated circuit devices 26. Accordingly, with probe pads 36 having relatively large size and large pitch, the cost of probing is reduced. On the other hand, bonding pads 32 are used for bonding to package component 122 (FIG. 4). Accordingly, with bonding pads 32 having a reduced size and a reduced pitch, more bonding pads 32 can be allocated, and hence more signal paths can be established between device die 22 and package component 122. In accordance with some embodiments, ratio W2/W1 may be in the range between about 1 and about 5. Ratio P2/P1 may also be in the range between about 1 and about 5.

Solder regions 34 and 38 are formed on top of bond pads 32 and probe pads 36, respectively. The respective process is also illustrated as process 202 in the process flow 200 as shown in FIG. 25. The formation of bond pads 32, probe pads 36 and solder regions 34 and 38 may include depositing a metal seed layer, forming and patterning a plating mask such as a photo resist, and plating bond pads 32, probe pads 36 and solder regions 34 and 38 in the openings in the patterned plating mask. The metal seed layer may include a copper layer, or a titanium layer and a copper layer over the titanium layer. The plated bond pads 32 and probe pads 36 may include copper, nickel, palladium, or composite layers thereof. The patterned plating mask is then removed, followed by an etching process to remove the portions of the metal seed layer that were previously covered by the plating mask. A reflow process is then performed to reflow solder regions 34 and 38.

Further referring to FIG. 1, device dies 22 are probed, for example, by putting the pins of probe card 40 into contact with solder regions 38. The respective process is illustrated as process 204 in the process flow 200 as shown in FIG. 25. Probe card 40 is connected to a probing device (not shown), which is electrically connected to a tool (not shown) configured to determine the connection and the functionality of device dies 22. Through the probing of device dies 22, it can be determined which of device dies 22 are defective dies, and which of device dies 22 are functioning (good) dies. The solder regions 38 are softer than the underlying probe pads 36, so that the pins in the probe card 40 can have better electrical connection to probe pads 36.

Figure 2:
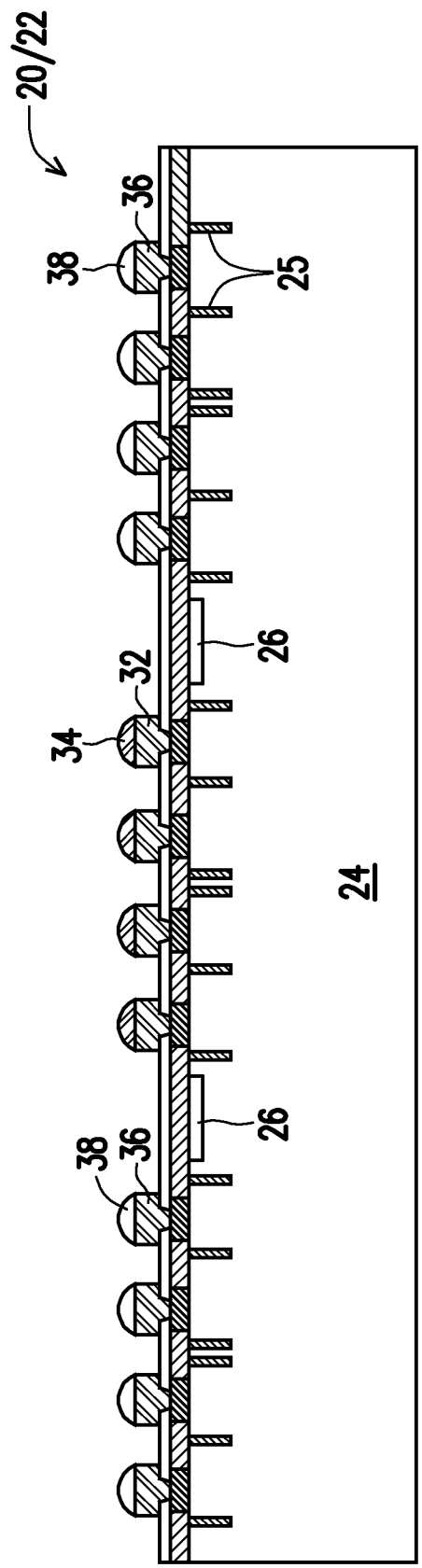

Referring to FIG. 2, after the probing process, solder regions 38 are removed through etching in accordance with some embodiments. The respective process is illustrated as process 206 in the process flow 200 as shown in FIG. 25. Solder regions 34, on the other hand, are left un-etched. In accordance with alternative embodiments, solder regions 38 are not etched, and are left in the final package, which is shown in FIGS. 20 through 23. In some of the subsequent figures, solder regions 38 are not illustrated. It is appreciated, however, that solder regions 38 may still exist (or may not exist) in these figures.

Figure 3:
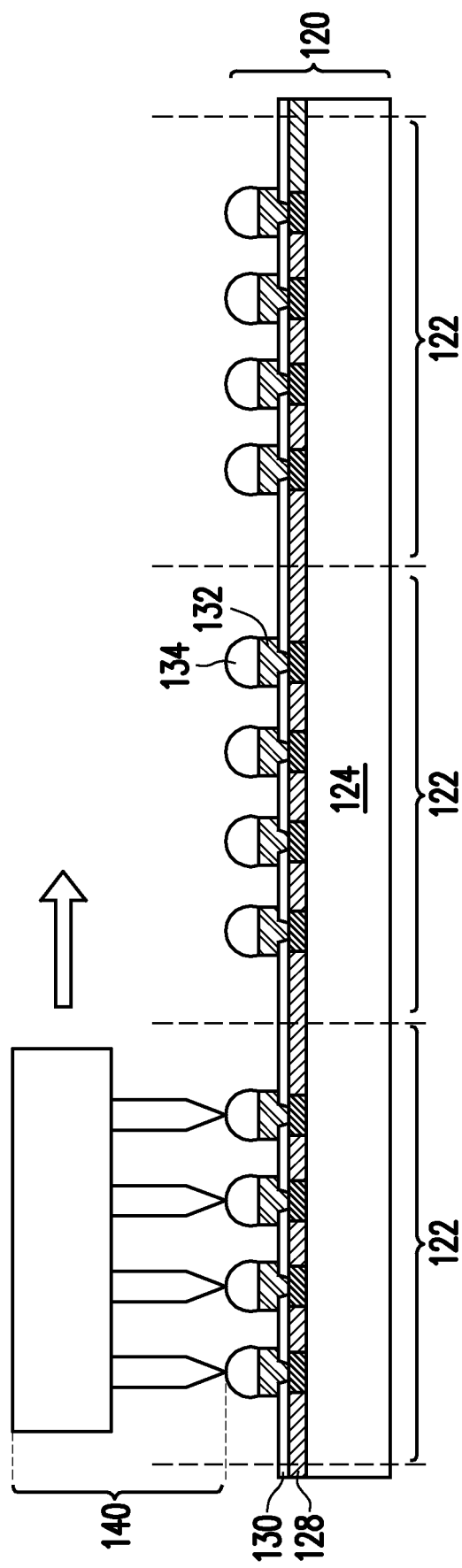

FIG. 3 illustrates the probing and the singulation of wafer 120 into discrete dies 122. Device dies 122 may also be ASIC dies, which may be logic dies or memory dies or the like. In accordance with some embodiments, wafer 120 includes semiconductor substrate 124 and integrated circuit devices (not shown), which may include active devices such as transistors and passive devices. Interconnect structure 128 is formed over semiconductor substrate 124, and is used to connect to (and interconnect) the integrated circuit devices. The structure of interconnect structure 128 may also include dielectric layers (which may include low-k dielectric layers), metal lines, and vias etc. Surface dielectric layer 130 is formed at the surface of device dies 122. It is appreciated that although device dies are used as an example, other types of package components including, and not limited to, packages, memory stacks (such as High-Bandwidth Memory (HBM) stacks), or the like, may be used to replace device dies 122.

Bond pads 132 and solder regions 134 are formed at the surface of device dies 122. The respective process is illustrated as process 208 in the process flow 200 as shown in FIG. 25. The formation process and the materials of bond pads 132 and solder regions 134 may be similar to that of bond pads 32 and solder regions 34 (FIG. 1). Device dies 122 are probed, for example, using probe card 140, so that defective device dies 122 are found, and known-good-dies are determined. The probing is performed on each of device dies 122. After the probing, wafer 120 is singulated in a die-saw process to separate device dies 122 from each other. The respective process is illustrated as process 210 in the process flow 200 as shown in FIG. 25. The known-good-dies 122 are kept, and defective dies 122 are discarded.

Next, referring to FIG. 4, the known-good-dies 122 are bonded to the known-good-dies 22 in wafer 20. The respective process is illustrated as process 212 in the process flow 200 as shown in FIG. 25. Although one device die 122 and one device die 22 are illustrated, there are a plurality of device dies 22 and 122 bonded. Device dies 122 are discrete dies in die form, while device dies 22 are portions of an unsawed wafer 20 that is in the wafer form. The bonding process includes applying a flux onto solder regions 34, placing known-good-dies 122 onto known-good-dies 22, and performing a reflow process, so that solder regions 34 and 134 are molten to form solder regions 35. After the reflow process, underfill 42 is dispensed into the gaps between device dies 122 and the respective underlying device dies 22, and is then cured. Throughout the description, the structure including wafer 20 and the device dies 122 bonded thereon are collectively referred to as reconstructed wafer 44.

Figure 5:
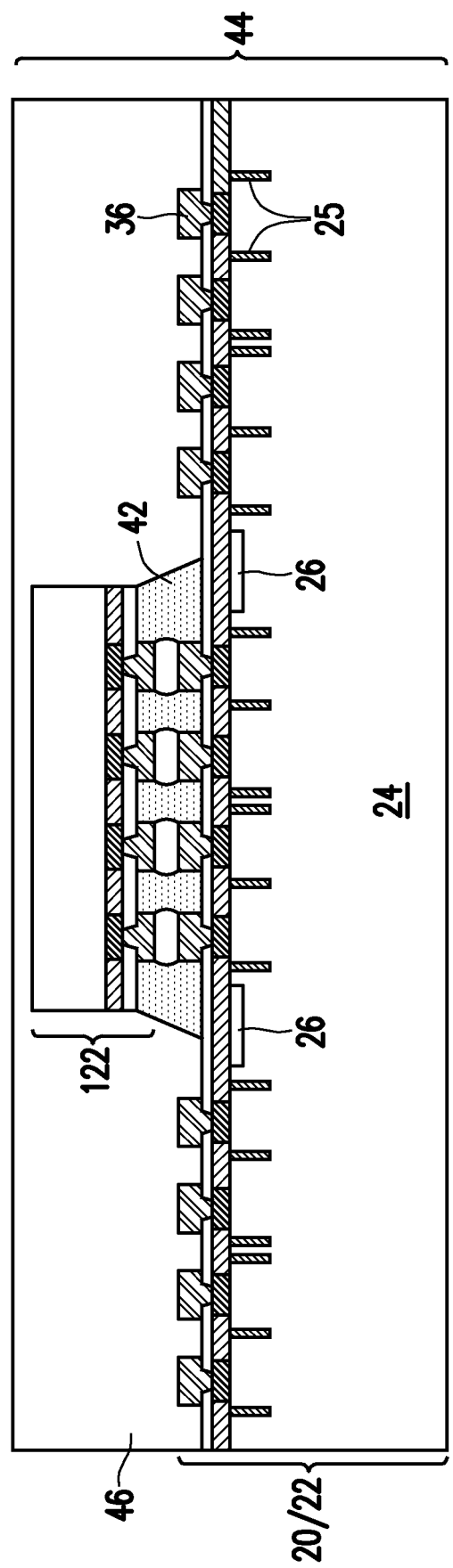

Referring to FIG. 5, device dies 122 are encapsulated in encapsulant 46. The respective process is illustrated as process 214 in the process flow 200 as shown in FIG. 25. Encapsulant 46 fills the gaps between neighboring device dies 122. Encapsulant 46 may be or may comprise a molding compound, a molding underfill, an epoxy, and/or a resin. After the encapsulation, the top surface of encapsulant 46 is higher than the top surfaces of device dies 122. Encapsulant 46 may include base material 46A (FIG. 24), which may be a polymer, a resin, an epoxy, or the like, and filler particles 46B in base material 46A. The filler particles 46B may be the particles of a dielectric material(s) such as $SiO_2$, $Al_2O_3$, silica, or the like, and may have spherical shapes. Also, the spherical filler particles 46B may have the same or different diameters. After the encapsulating process, a planarization process is performed to reduce the thickness, and to level the top surface, of encapsulant 46. Also, the top surface of encapsulant 46 is made planar for the subsequent processes.

Probe pads 36 are used for probing, and are not used for bonding to other package components. After the encapsulating, encapsulant 46 may be in contact with the sidewalls of the electrical connectors including probe pads 36, and possibly solder regions 38. For example, when solder regions 38 are removed after the probing, all sidewalls and top surfaces of probe pads 36 will be in physical contact with encapsulant 46. When solder regions 38 are not etched after the probing, solder regions 38 have the bottom surfaces contacting probe pads 36, while all of the sidewalls and the top surfaces of solder regions 38 may be in contact with encapsulant 46.

Figure 6:
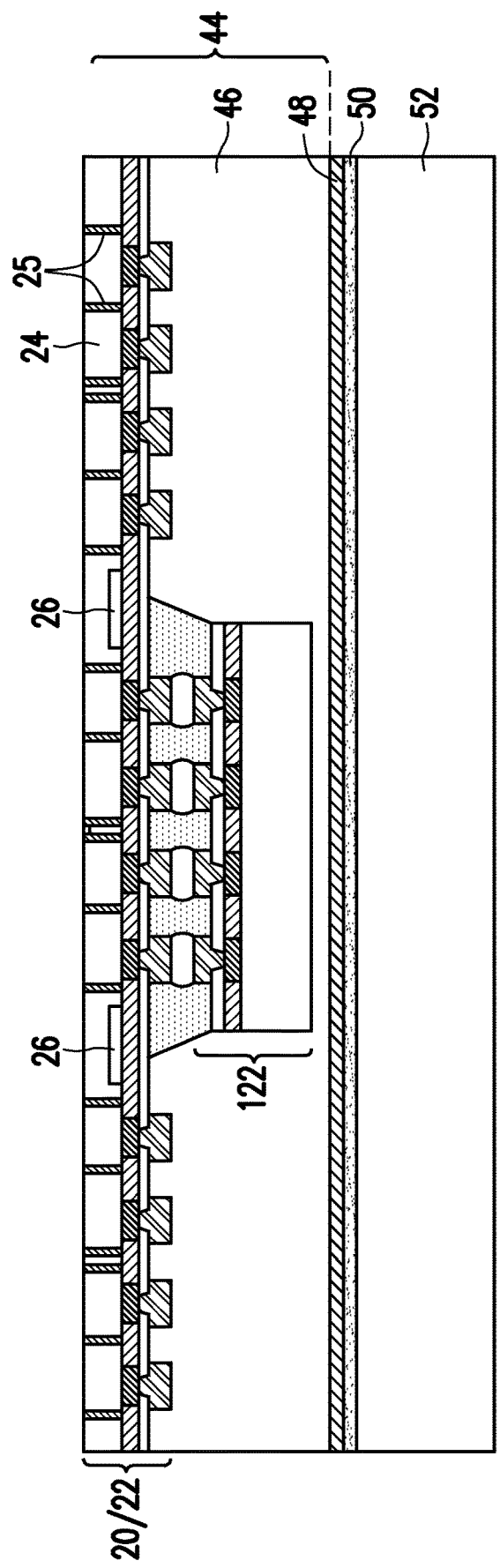

FIGS. 6-9 and 10A (or 10B) illustrate the formation of a backside interconnect structure for reconstructed wafer 44, which backside interconnect structure is on the backside of wafer 20. Referring to FIG. 6, reconstructed wafer 44 is attached to carrier 52 through release film 50. The respective process is illustrated as process 216 in the process flow 200 as shown in FIG. 25. Die-Attach Film (DAF) 48, which is an adhesive film, may also be used to attach reconstructed wafer 44 to release film 50. Release film 50 may be formed of a polymer-based material (such as a Light-To-Heat-Conversion (LTHC) material), which may be broken down when subject to the heat from light (such as a laser beam). Carbon black particles may be added into release film 50 to improve energy absorption.

Figure 7:
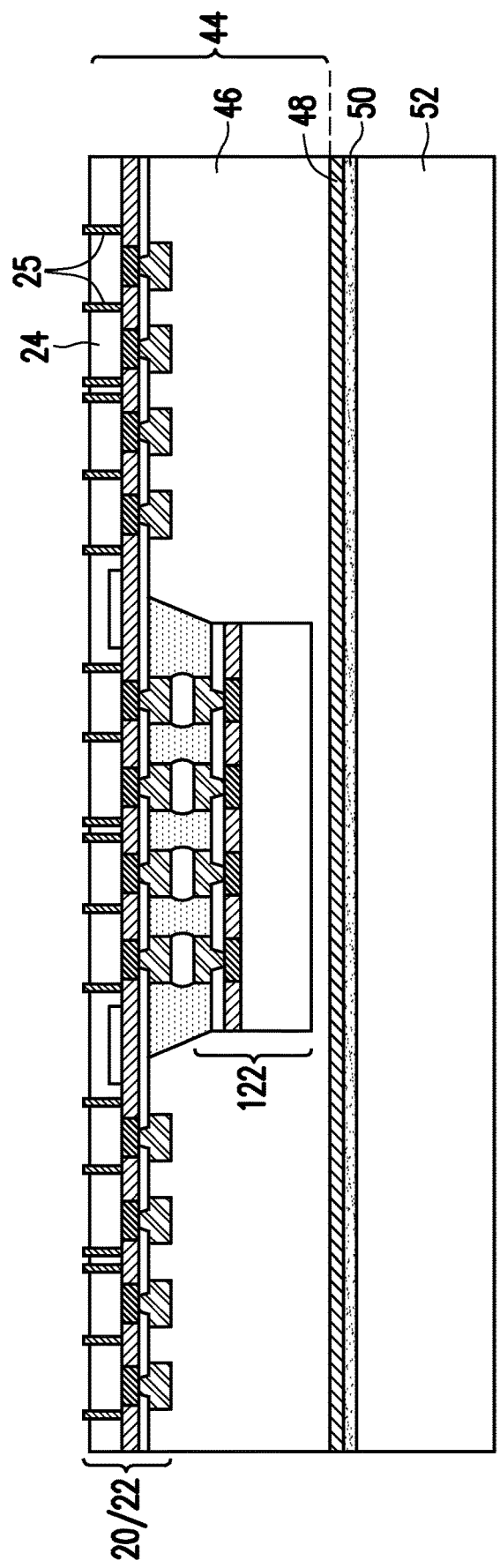

A backside grinding process is performed on wafer 20 to remove a portion of substrate 24, until through-vias 25 are revealed. The respective process is illustrated as process 218 in the process flow 200 as shown in FIG. 25. Next, as shown in FIG. 7, substrate 24 is recessed slightly (for example, through etching), so that through-vias 25 protrude out of the back surface of substrate 24. The respective process is illustrated as process 220 in the process flow 200 as shown in FIG. 25. A wet clean process is then performed, for example, to remove the polymer generated in the etching process.

Figure 8:
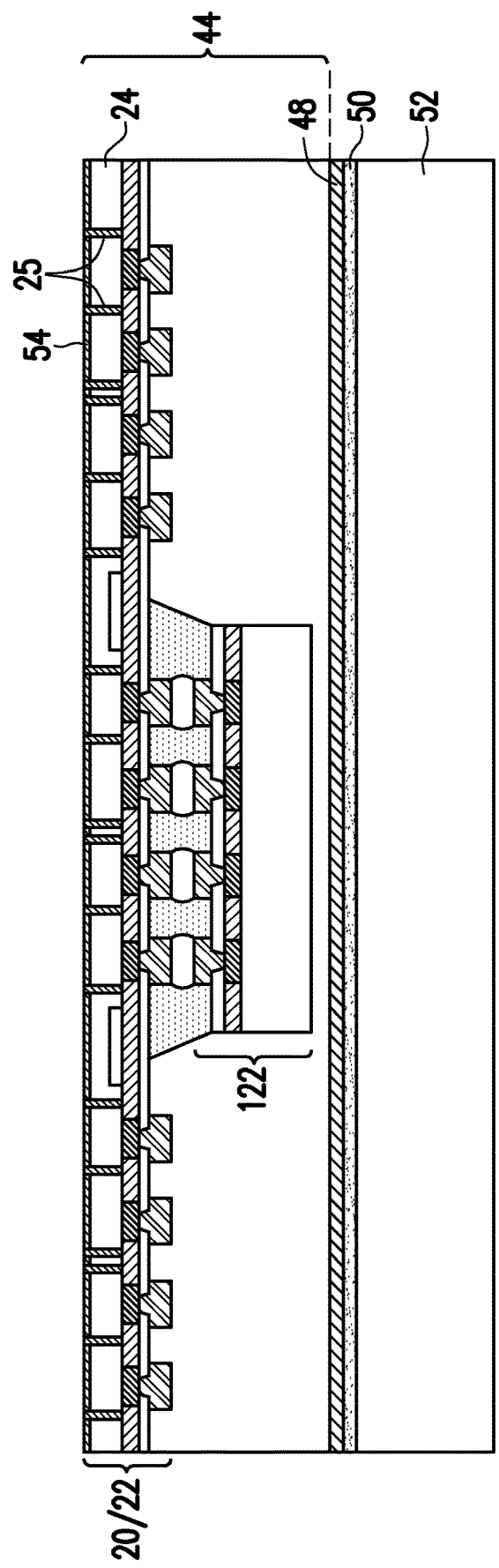

Referring to FIG. 8, dielectric layer 54 is deposited, followed by a planarization process such as a CMP process or a mechanical grinding process to re-expose through-vias 25. The respective process is illustrated as process 222 in the process flow 200 as shown in FIG. 25. Dielectric layer 54 may be formed of or comprise silicon nitride, silicon oxide, silicon oxynitride, or the like. The deposition process may be performed through Plasma Enhance Chemical Vapor Deposition (PECVD), Atomic Layer Deposition (ALD), or the like. After the planarization process, through-vias 25 also penetrate through dielectric layer 54, as shown in FIG. 8.

Figure 9:
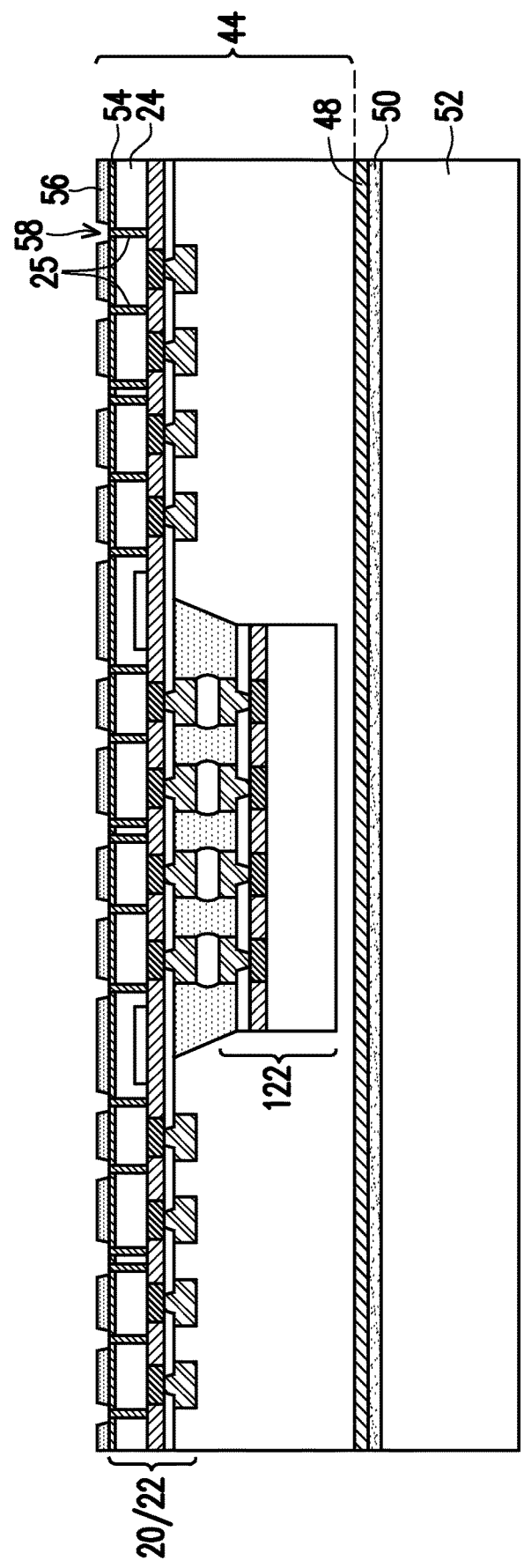

Referring to FIG. 9, dielectric (isolation) layer 56 is formed. The respective process is illustrated as process 224 in the process flow 200 as shown in FIG. 25. In accordance with some embodiments of the present disclosure, dielectric layer 56 is formed of a polymer such as PBO, polyimide, or the like. The formation method may include coating dielectric layer 56 in a flowable form, and then curing dielectric layer 56. In accordance with alternative embodiments of the present disclosure, dielectric layer 56 is formed of an inorganic dielectric material such as silicon nitride, silicon oxide, or the like. The formation method may include CVD, ALD, PECVD, or other applicable deposition methods. Openings 58 are then formed, for example, through a photo lithography process. In accordance with some embodiments in which dielectric layer 56 is formed of a photo-sensitive material such as PBO or polyimide, the formation of openings 58 involves a photo exposure process using a lithography mask (not shown), and a development process. Through-vias 25 are exposed through openings 58.

Figure 10A:
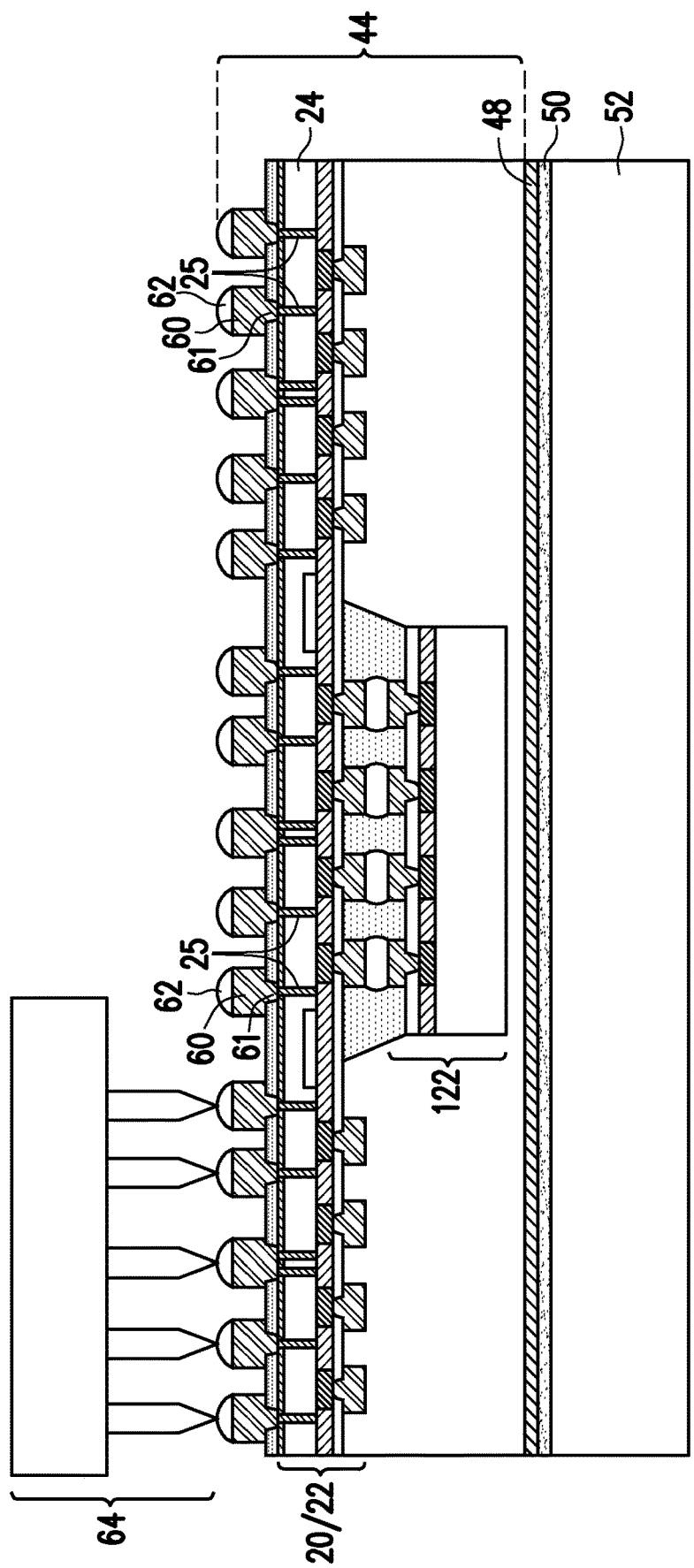

Next, referring to FIG. 10A, non-solder conductive features including conductive pillars 60 and vias 61 are formed. The respective process is illustrated as process 226 in the process flow 200 as shown in FIG. 25. Vias 61 extend into dielectric layer 56 to join to through-vias 25, and conductive pillars 60 are connected to through-vias 25. In accordance with some embodiments of the present disclosure, conductive pillars 60 and vias 61 are formed in a plating process, which includes depositing a metal seed layer (not shown), forming and patterning a plating mask (such as a photo resist (not shown)) over the metal seed layer, and plating a metallic material such as copper and/or aluminum over the metal seed layer. The metallic material of conductive pillars 60 are non-solder metallic materials. The metal seed layer and the plated metallic material may be formed of the same material or different materials. The patterned plating mask is then removed, followed by etching the portions of the metal seed layer previously covered by the patterned plating mask.

Figure 16A:
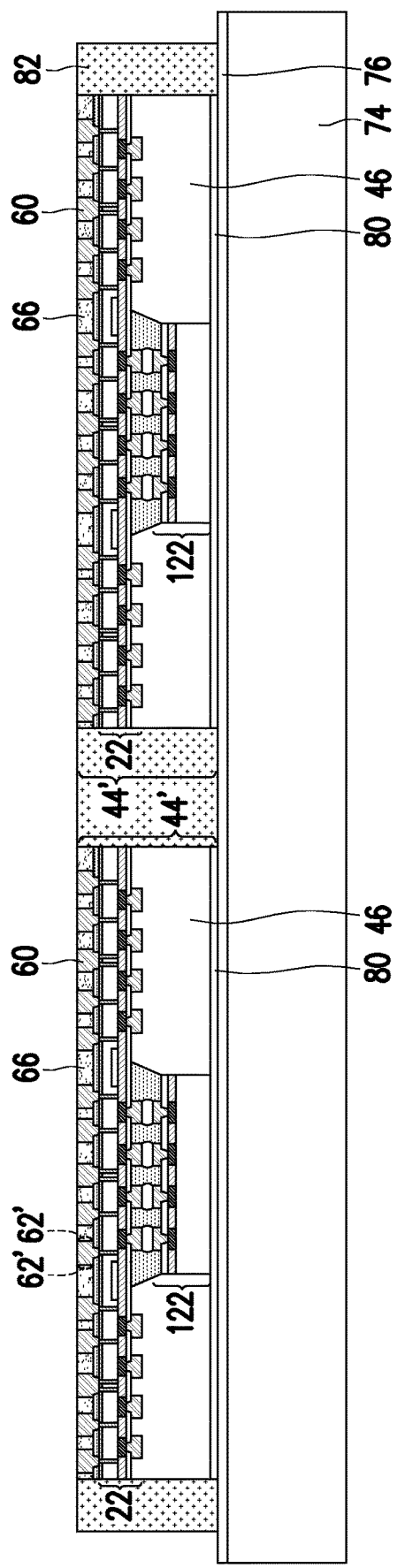
Figure 16B:
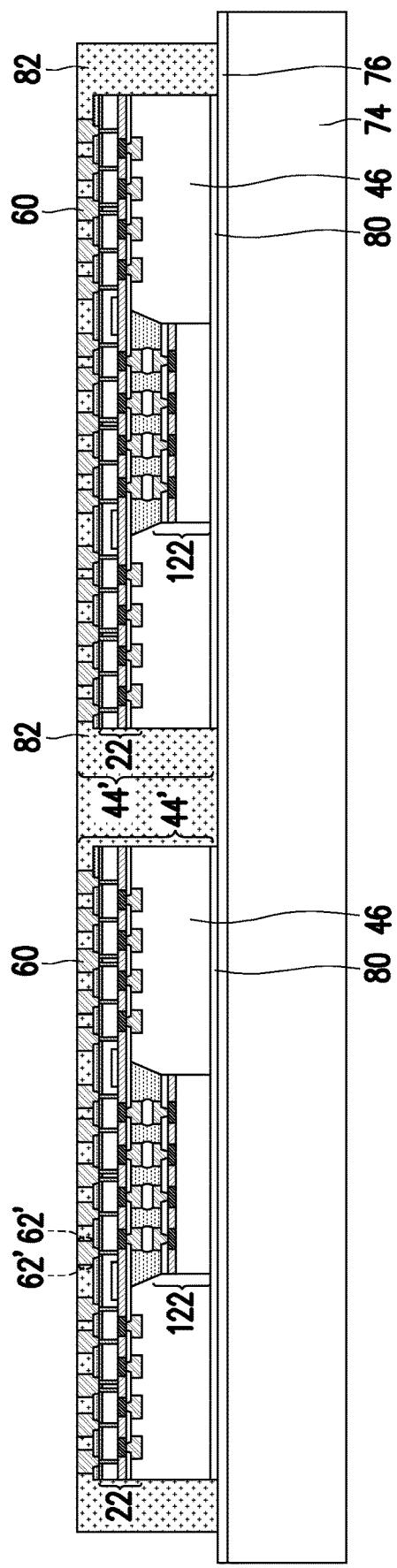

On top of conductive pillars 60, solder regions 62 may be formed. In accordance with some embodiments, solder regions 62 are formed through plating, and the same plating mask used for forming conductive pillars 60 and vias 61 may be used for plating solder regions 62. Solder regions 62 are reflowed to have round top surfaces. There may be, or may not be, some portions of solder regions 62 flowing to the sidewalls of conductive pillars 60. A probing process is then performed using probe card 64 to test the circuits and the functionality of reconstructed wafer 44. For example, the joined function of device dies 122 and 22 after they are bonded may be tested. The respective process is illustrated as process 228 in the process flow 200 as shown in FIG. 25. In accordance with some embodiments, after the probing process, solder regions 62 are removed, for example, through an etching process. In accordance with alternative embodiments, solder regions 62 are not etched, and are removed through a subsequent planarization process as shown in FIG. 16A or FIG. 16B. Accordingly, solder regions 62 are shown as dashed to indicate they may be removed or may be left un-removed at this time.

Figure 10B:
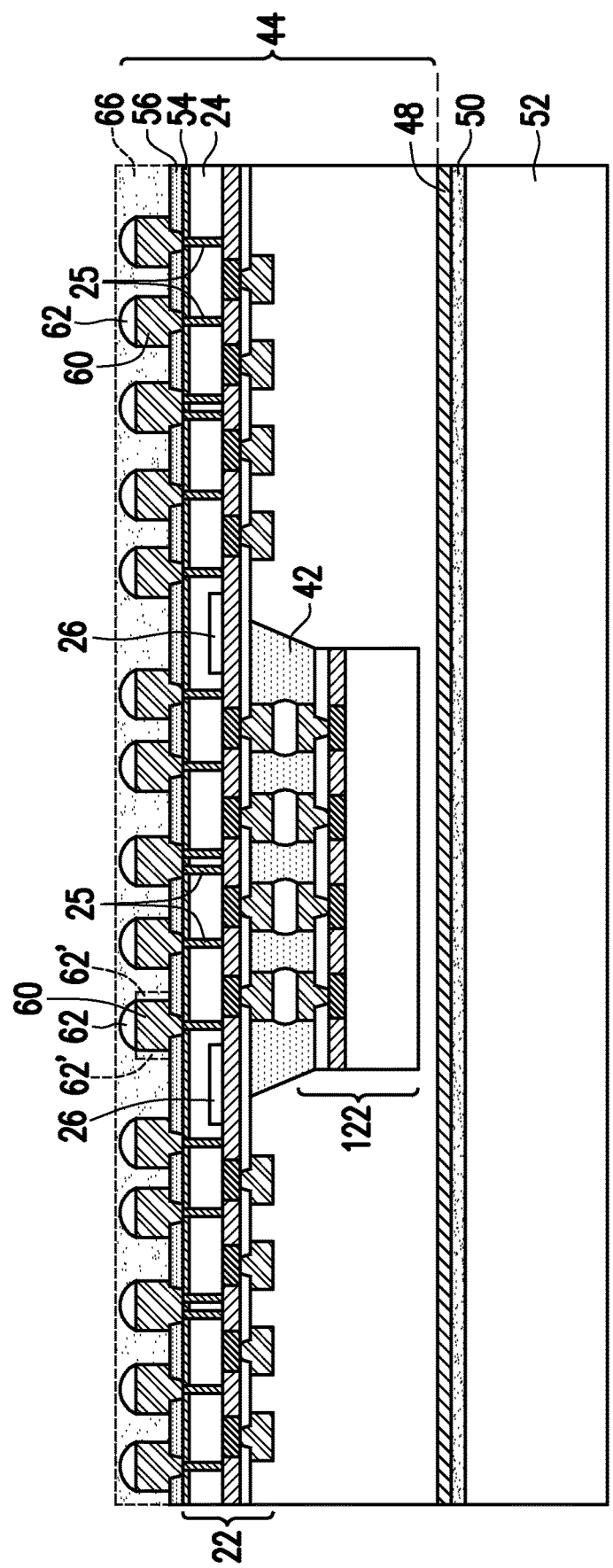
Figure 11:
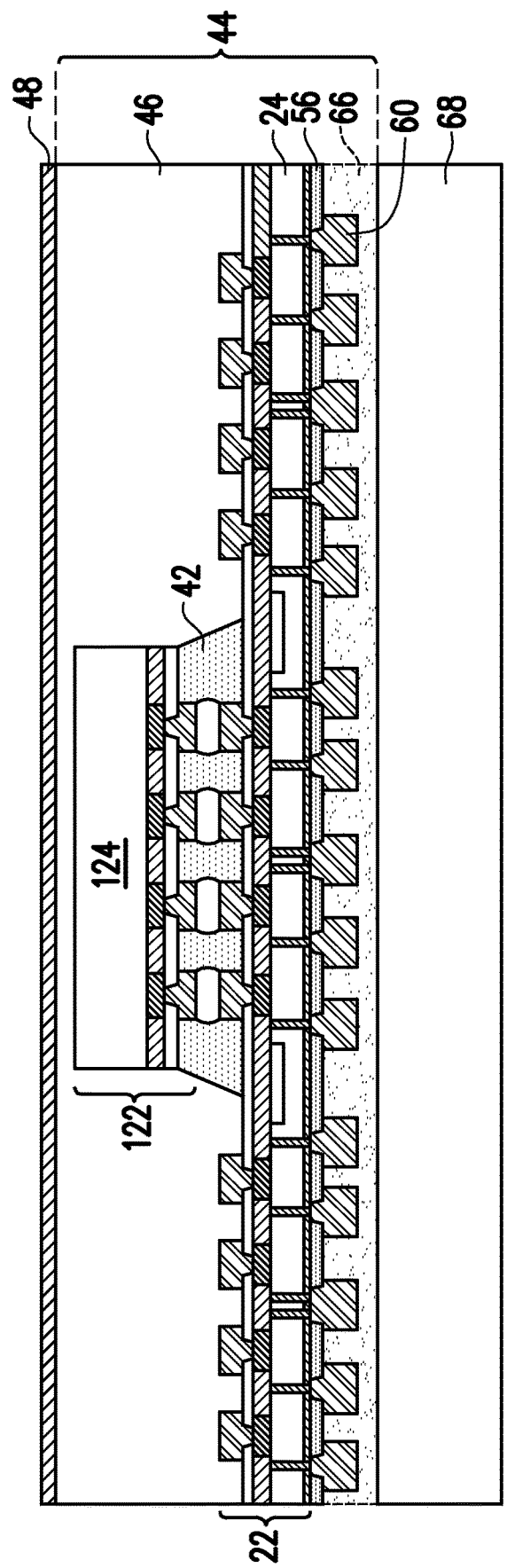

After the formation of conductive pillars 60, conductive pillars 60 may be left un-covered, as shown in FIG. 10A, and the subsequent process such as the process shown in FIG. 11 may be performed. In accordance with alternative embodiments, as shown in FIG. 10B, dielectric layer 66 is formed to encapsulate conductive pillars 60. In accordance with some embodiments, dielectric layer 66 is formed of a polymer such as PBO, polyimide, or the like. For example, dielectric layer 66 may be formed of a low-temperature polyimide (LTPI).

Next, reconstructed wafer 44 is attached to tape 68, as shown in FIG. 11. Reconstructed wafer 44 is demounted from carrier 52 (FIG. 10A or 10B), for example, by projecting a light beam (such as laser beam) on release film 50, and the light penetrates through the transparent carrier 52. The respective process is illustrated as process 230 in the process flow 200 as shown in FIG. 25. The release film 50 is thus decomposed, and reconstructed wafer 44 is released from carrier 52. In accordance with some embodiments in which dielectric layer 66 is formed, dielectric layer 66 is attached to tape 68, as shown in FIG. 11. In accordance with other embodiments in which dielectric layer 66 is not formed, conductive pillars 60 (and solder regions 62, if any) protrudes into tape 68.

Figure 12:
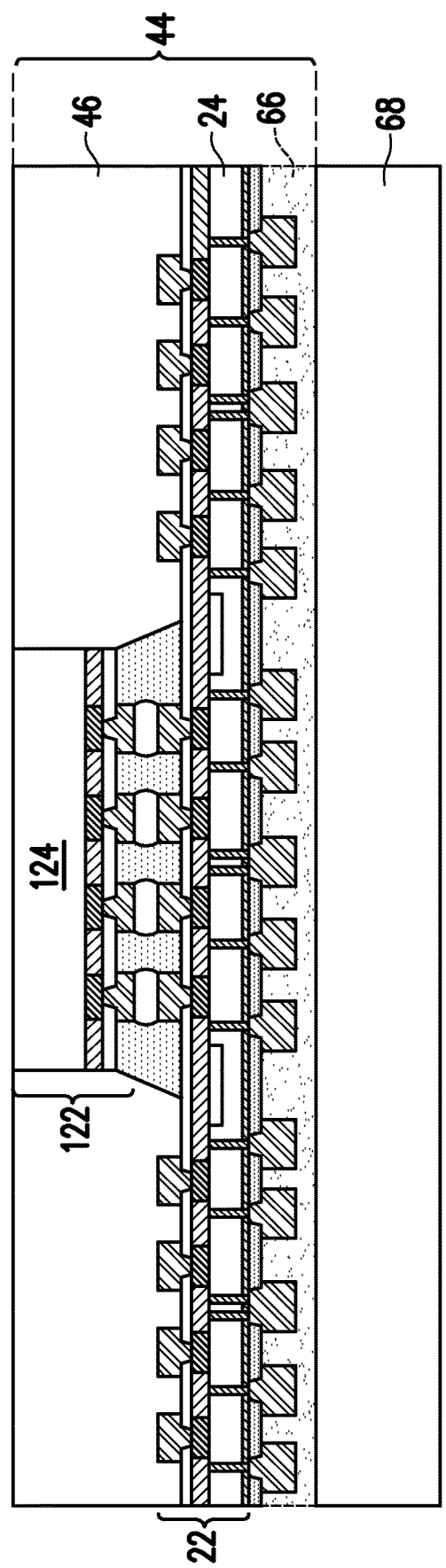

In a subsequent process, DAF 48 is removed in a cleaning process, followed by a planarization process such as a CMP process or a mechanical grinding process to remove excess portions of encapsulant 46, until semiconductor substrate 124 is exposed. Semiconductor substrate 124 is also thinned by the planarization process. The respective process is illustrated as process 232 in the process flow 200 as shown in FIG. 25. The resulting structure is shown in FIG. 12.

Figure 13:
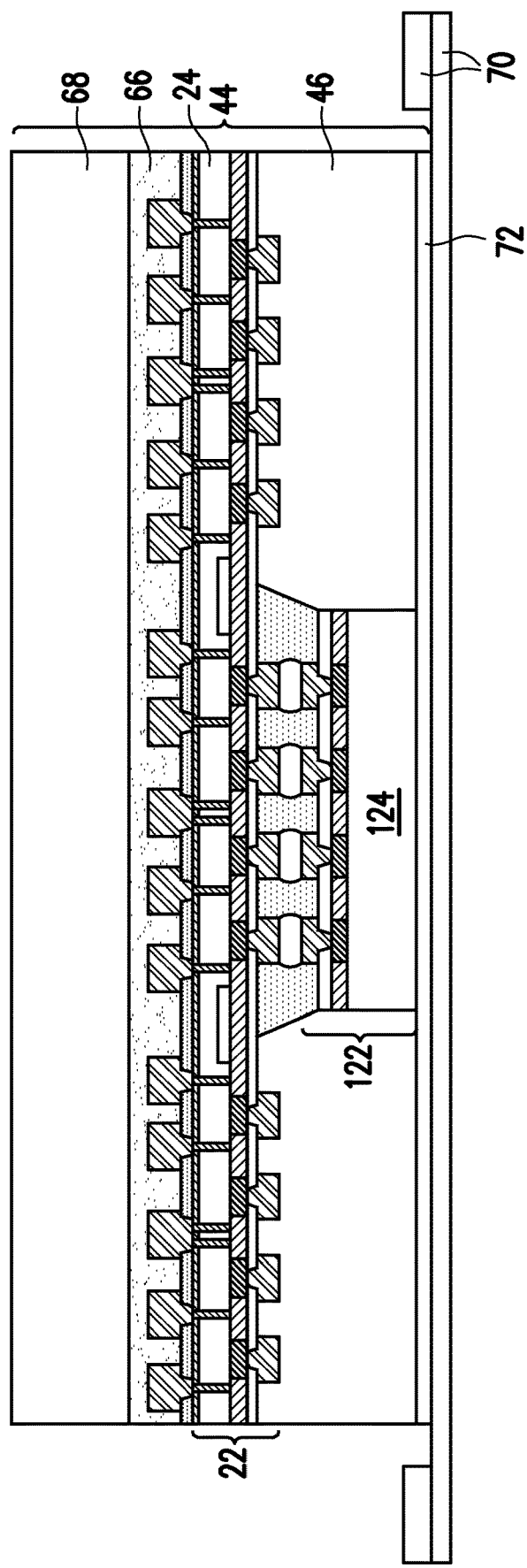

Referring to FIG. 13, reconstructed wafer 44 along with the tape 68 attached thereon are further attached to frame 70 through DAF 72. Next, referring to FIG. 14, tape 68 is removed, so that dielectric layer 66 (if formed), the underlying solder regions 62 (when not etched), or conductive pillars 60 are exposed. A singulation process is then performed through die-sawing, so that reconstructed wafer 44 is separated into packages 44', which also include die stacks. The respective process is illustrated as process 234 in the process flow 200 as shown in FIG. 25.

Figure 15A:
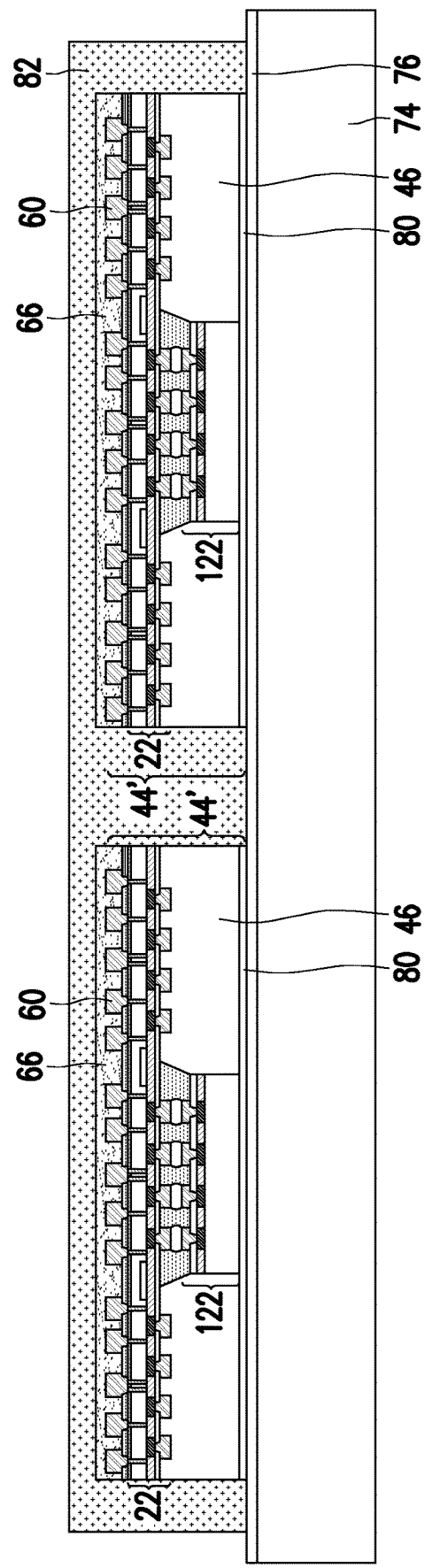

Packages 44' are then used to form Integrated Fan-Out (InFO) packages. Referring to FIG. 15A, packages 44' are placed over carrier 74 and release film 76 through DAFs 80. Next, an encapsulation process is performed, and packages 44' are encapsulated in encapsulant 82. The respective process is illustrated as process 236 in the process flow 200 as shown in FIG. 25. Encapsulant 82 may also include a base material 82A (FIG. 24) and filler particles 82B in base material 82A. The materials of base material 82A and filler particles 82B may be similar to that of base material 46A and filler particles 46B (FIG. 24), respectively. Referring to FIG. 16A, a planarization process such as a CMP process or a mechanical grinding process is performed to reveal the top surfaces of conductive pillars 60.

Figure 15B:
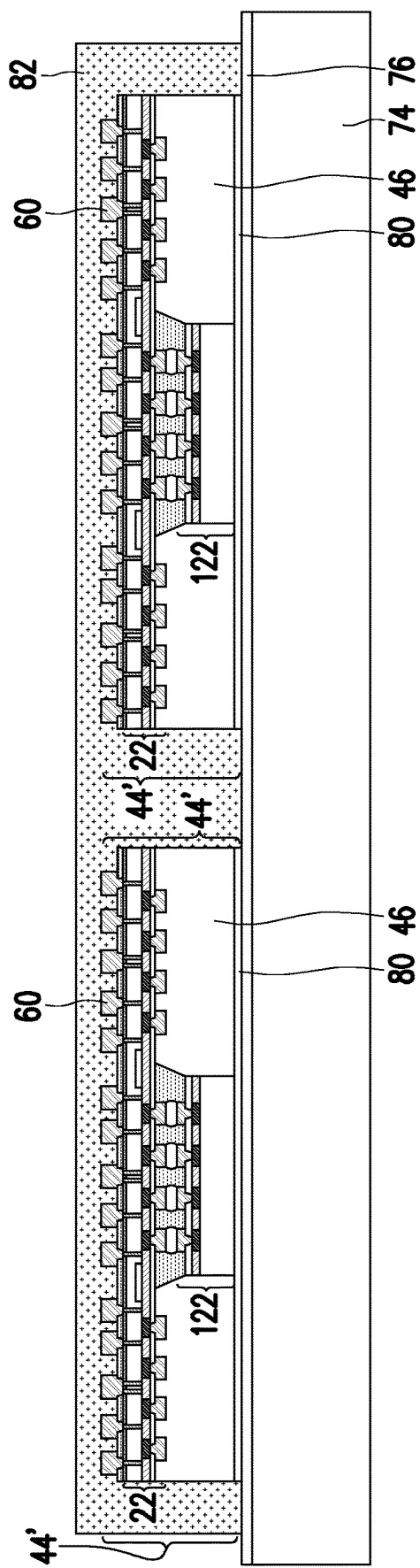

In accordance with the embodiments as shown in FIGS. 15A and 16A, dielectric layer 66 was formed to encircle and contact the sidewalls of conductive pillars 60. FIGS. 15B and 16B illustrates an alternative embodiment similar to the embodiments shown in FIGS. 15A and 16A, respectively, except that dielectric layer 66 was not formed, and encapsulant 82 is filled into the spaces between conductive pillars 60. As a result, after the planarization process as shown in FIG. 16B is performed, encapsulant 82 still has a portion directly over device die 22, and the portion encircles and contacts conductive pillars 60.

In accordance with some embodiments in which solder regions 62 are not etched (FIG. 10B), the portions of solder regions 62 directly over conductive pillars 60 are removed. When there are some portions 62' of solder regions 62 (FIGS. 16A and 16B) flowing onto the sidewalls of conductive pillars 60, portions 62' may remain after the planarization process. The remaining portions 62' may also exist in the packages shown in FIGS. 21 through 23.

Figure 17:
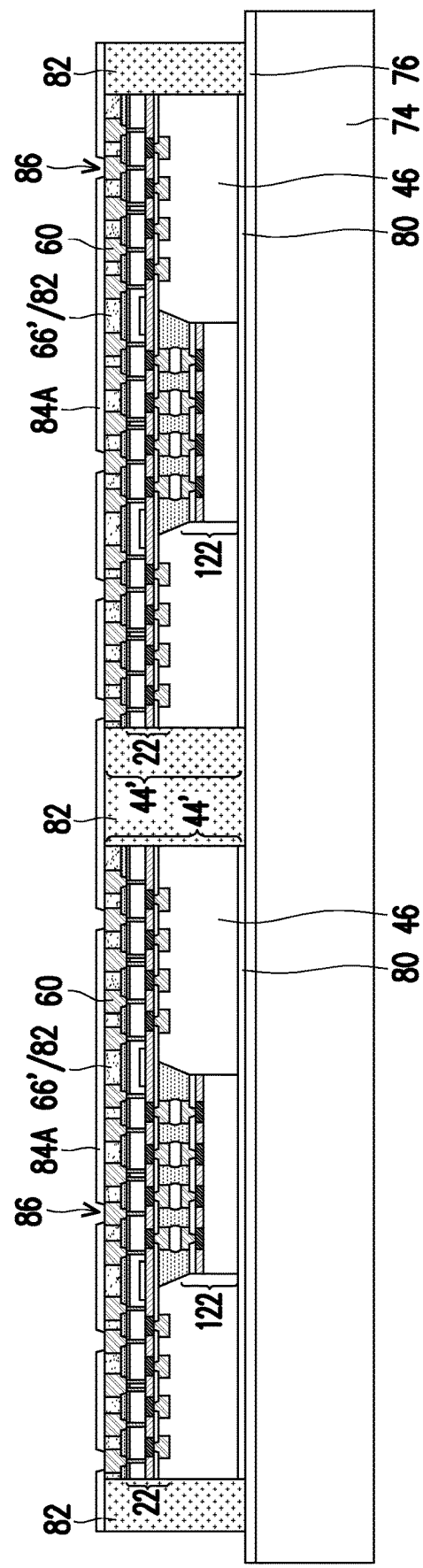
Figure 18:
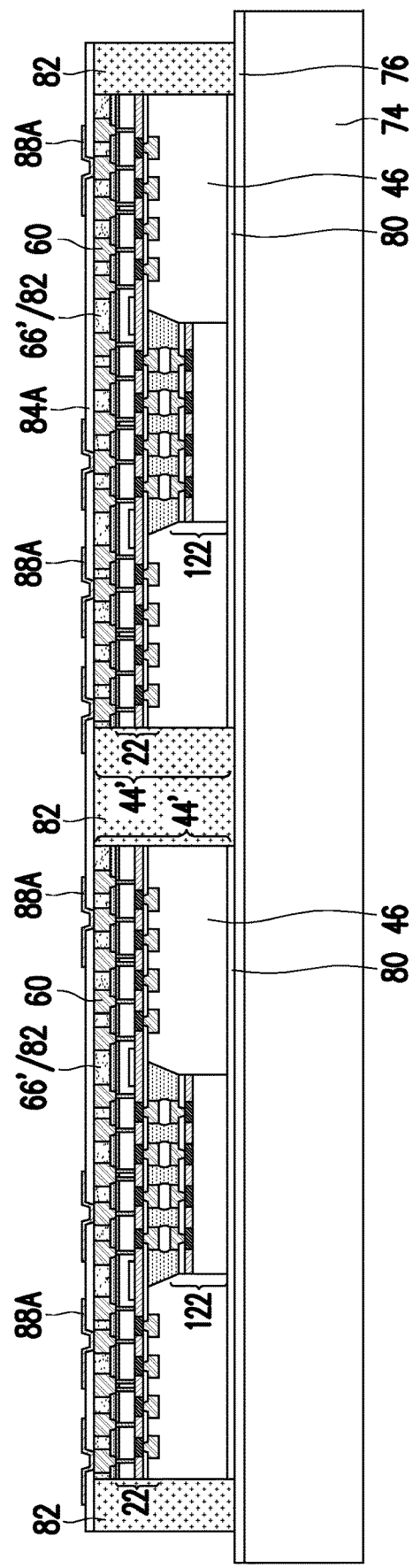
Figure 19:
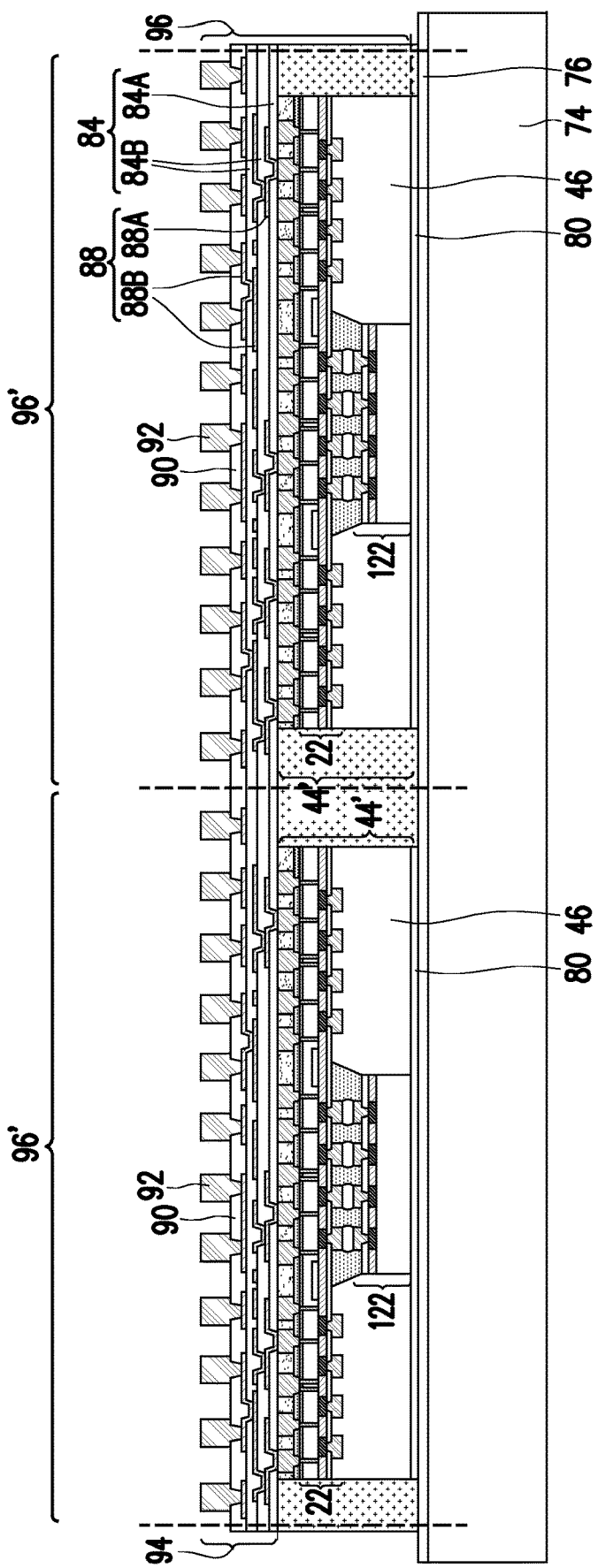

FIGS. 17 through 19 illustrate the processes for forming a fan-out interconnect structure in accordance with some embodiments. The respective process is illustrated as process 238 in the process flow 200 as shown in FIG. 25. Referring to FIG. 17, dielectric layer 84A is formed. In accordance with some embodiments of the present disclosure, dielectric layer 84A is formed of a polymer such as PBO, polyimide, or the like, or formed of an inorganic dielectric material such as silicon nitride, silicon oxide, or the like. Openings 86 are then formed, for example, through a photo lithography process. Conductive pillars 60 are exposed through openings 86. It is appreciated that openings 86 may be formed directly over all (although only some are shown) of conductive pillars 60.

Next, referring to FIG. 18, Redistribution Lines (RDLs) 88A are formed. In accordance with some embodiments of the present disclosure, RDLs 88A are formed in a plating process, which process may be similar to the formation of conductive pillars 60 and vias 61.

In subsequent processes, as shown in FIG. 19, more dielectric layers 84B and RDLs 88B are formed. Throughout the description, dielectric layers 84A and 84B are collectively referred to as dielectric layers 84, and RDLs 88A and 88B are collectively referred to as RDLs 88. RDLs 88A and/or 88B extend laterally beyond the edges of the respective underlying packages 44' to form fan-out packages. Dielectric layer 90 and electrical connectors 92 are then formed to electrically connect to package 44'. In accordance with some embodiments, electrical connectors 92 comprise conductive (non-solder) pillars, and may or may not include solder regions on top of the conductive pillars. InFO interconnect structure 94 is thus formed. Throughout the description, the illustrated structures over DAFs 80 are collectively referred to as reconstructed wafer 96.

In subsequent processes, reconstructed wafer 96 is de-bonded from carrier 74, followed by the removal of DAFs 80, for example, through a CMP process or a mechanical grinding process. A singulation process may then be performed to separate reconstructed wafer 96 into separate packages 96'. The respective process is illustrated as process 240 in the process flow 200 as shown in FIG. 25. An example package 96' is shown in FIG. 20.

Figure 14:
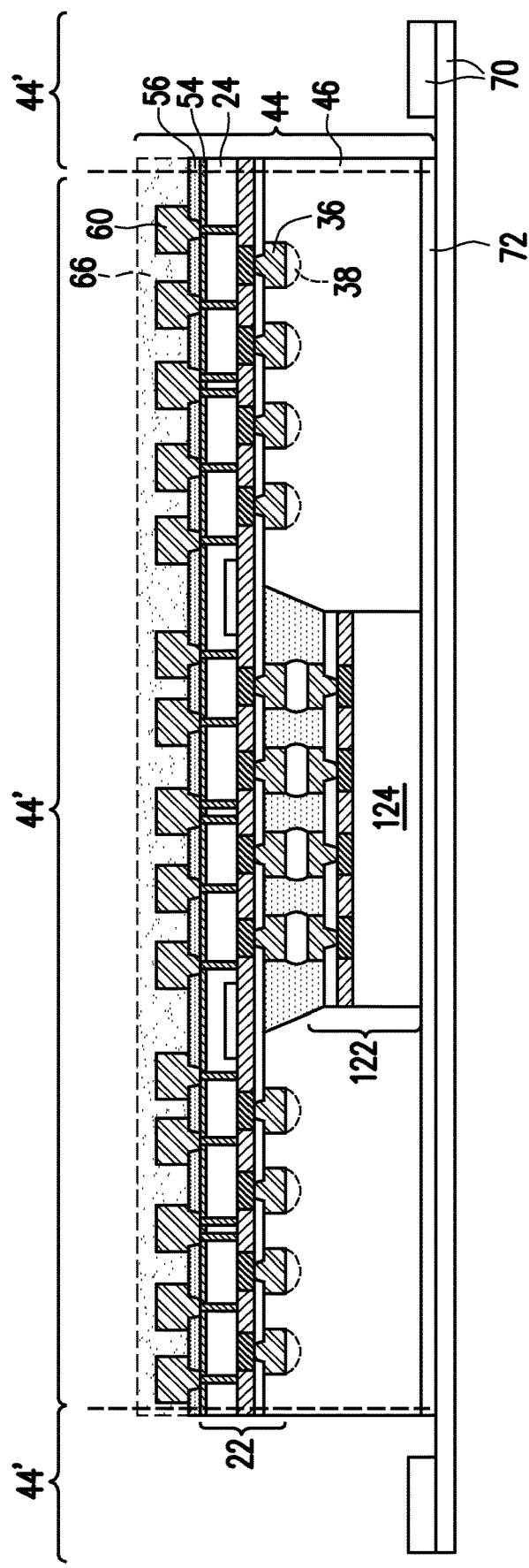
Figure 20:
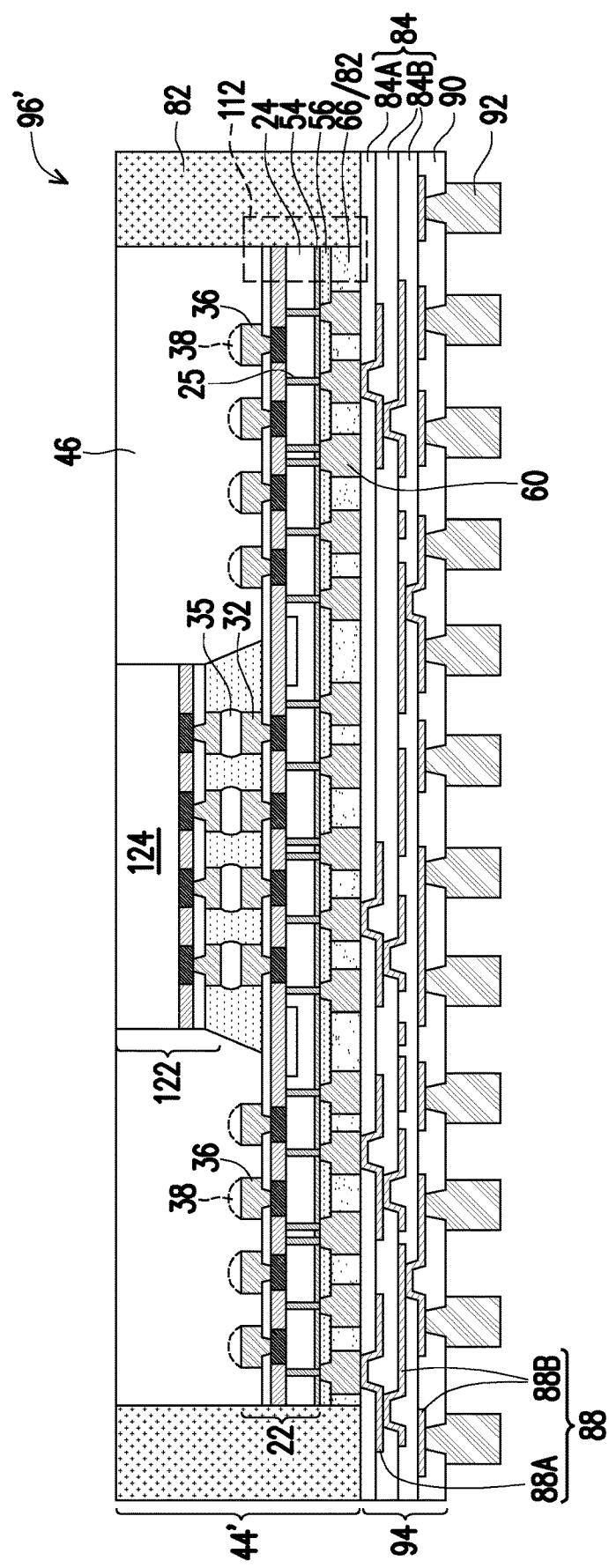
Figure 21:
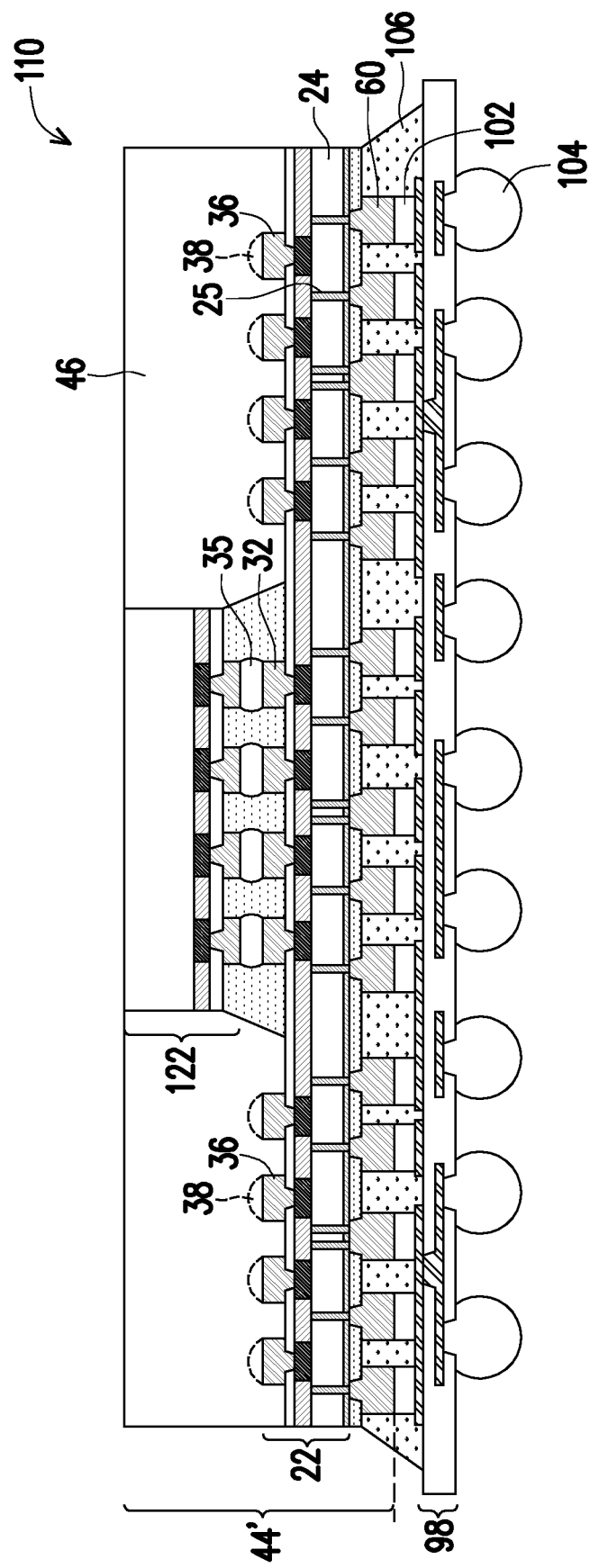
FIG. 21 illustrates a cross-sectional view of a package including a die stack in accordance with some embodiments.
Figure 22:
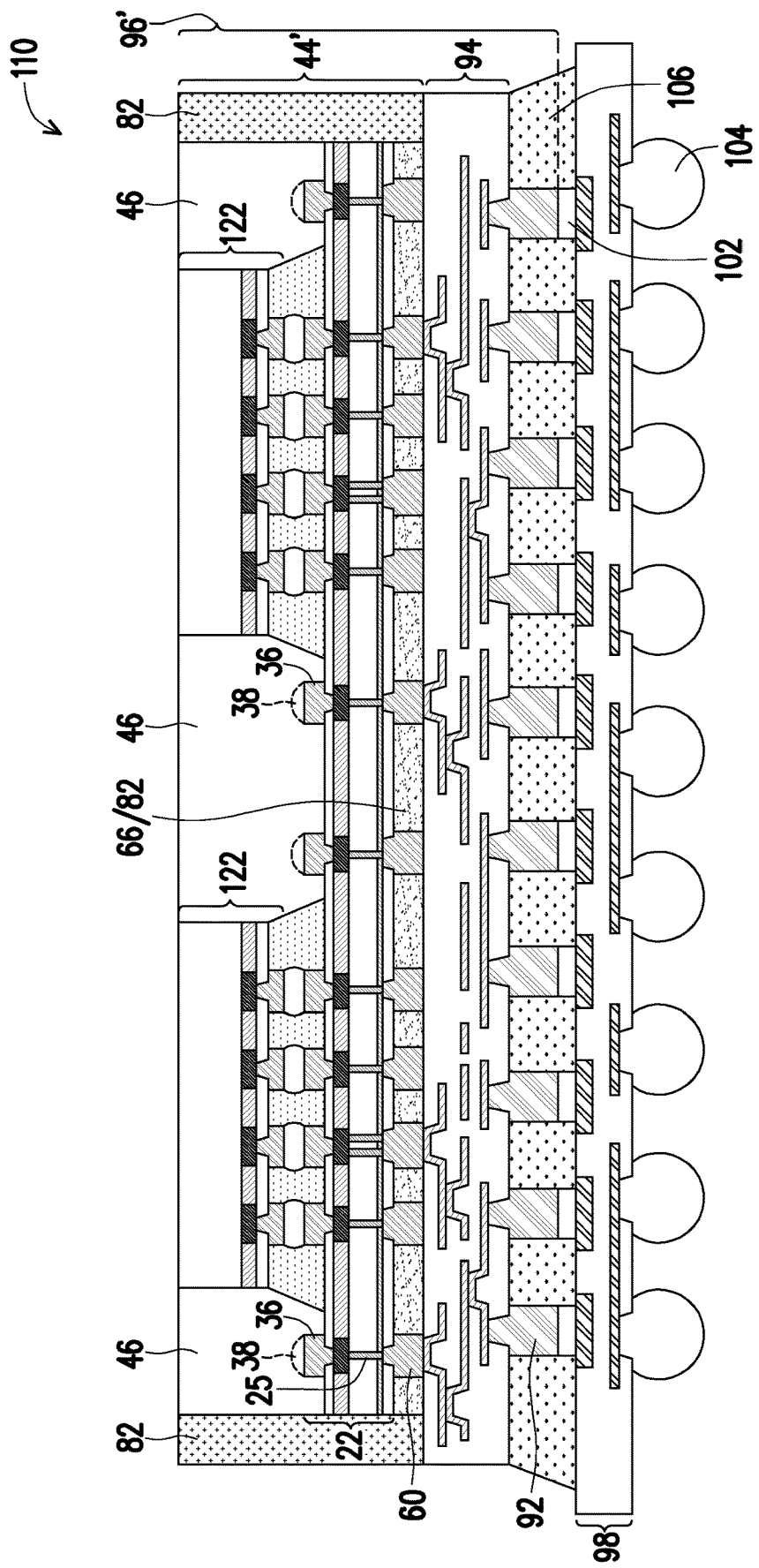
FIGS. 22 and 23 illustrate cross-sectional views of packages including die stacks in accordance with some embodiments.
Figure 23:
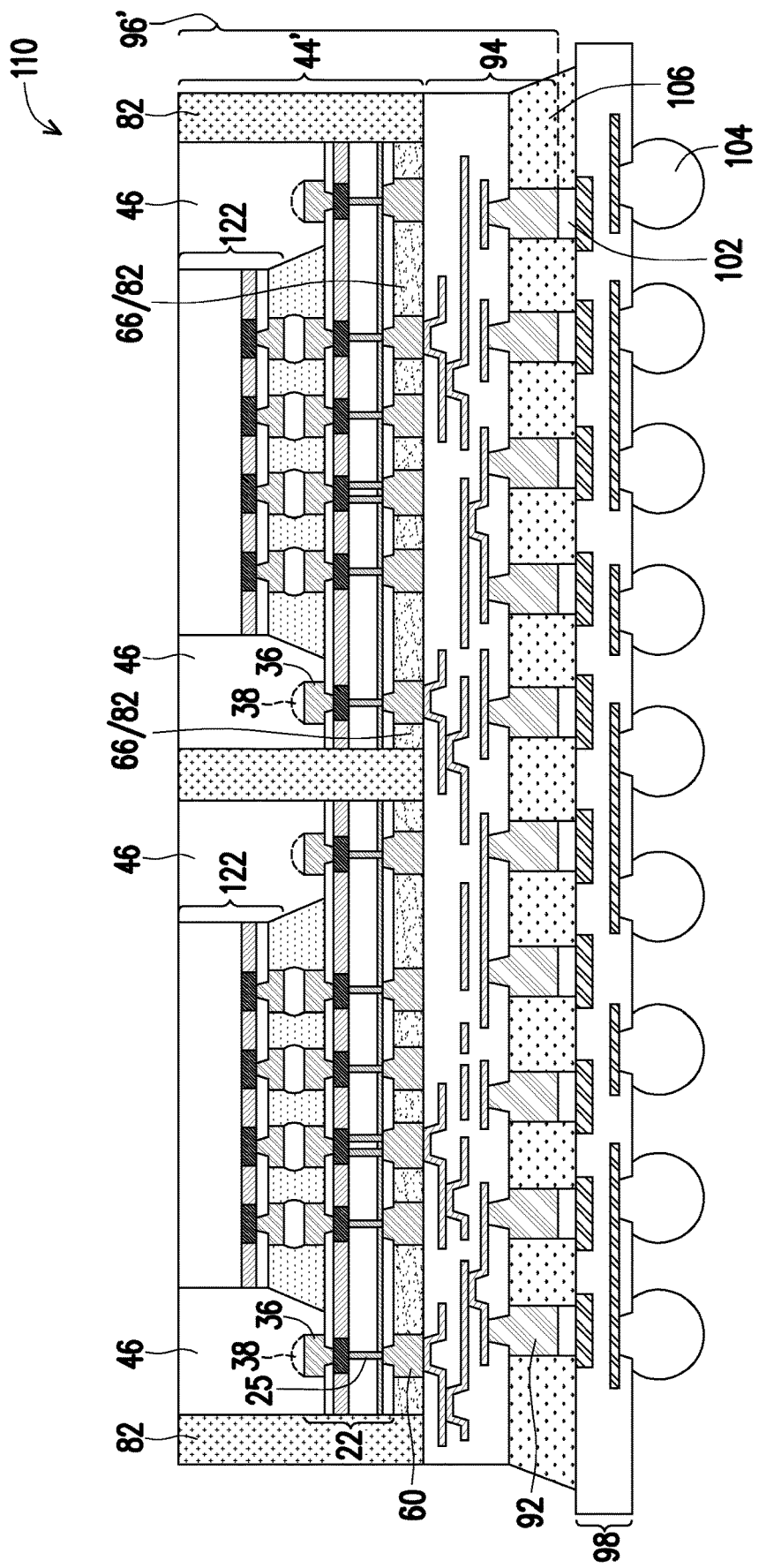

FIGS. 21 through 23 illustrate the packages formed based on the packages 44' (FIG. 14) or 96' (FIG. 20) formed in preceding processes. FIG. 21 illustrates a package formed in accordance with some embodiments, in which package 44', which is formed as a singulation process as shown in FIG. 14, is bonded to package component 98 through solder regions 102. Package component 98 may be a package substrate, another package, Printed Circuit Board (PCB), or the like. Underfill 106 is dispensed into the gap between package 44' and package component 98. Solder regions 104 are formed at the bottom of package component 98. Package 110 is thus formed.

FIGS. 22 and 23 illustrate the formation of packages 110 in accordance with alternative embodiments. It is appreciated that the packages 96' shown in FIGS. 22 and 23 are modified to be similar to, and are slightly different from the packages 96' as shown in FIG. 20. The packages 96' are bonded to the corresponding package components 98 through solder regions 102. In accordance with alternative embodiments, package 96 as shown in in FIG. 20 may be directly bonded to (without modification) package component 98 to form package 110. The package 96' as shown in FIG. 22 differs from the package 96' in FIG. 20 in that two device dies 122 are bonded to the same device die 22. The package 96' as shown in FIG. 23 differs from the package 96' in FIG. 20 in that two packages 44' are included in package 96'. One of ordinary skill in the art will realize the formation of these packages with the teaching provided in accordance with the embodiments of the present disclosure.

Figure 24:
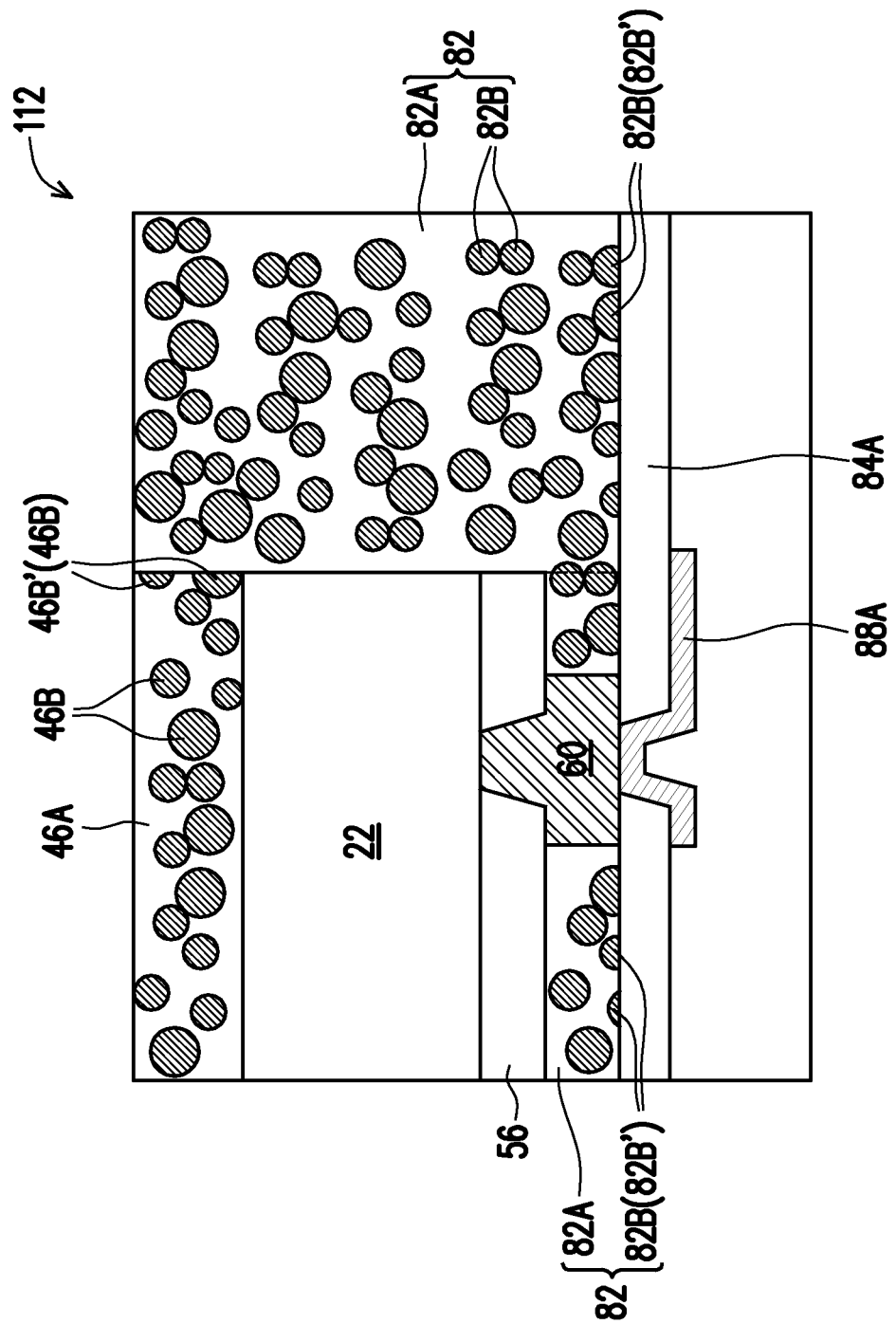
FIG. 24 illustrates a magnified view of a portion of a package in accordance with some embodiments.

FIG. 24 illustrates a magnified view of region 112 in FIG. 20 in accordance with some embodiments. Due to the die-saw process for the singulation of package 44', the spherical particles 46B' of encapsulant 46 are sawed, and hence at the interface between encapsulant 46 and encapsulant 82, there are partial particles 46B', which are the particles partially cut due to the die-saw process. The interface between encapsulant 46 and encapsulant 82 is thus distinguishable. Furthermore, due to the planarization process (FIG. 16A) performed before the formation of interconnect structure, the spherical particles 82B' of encapsulant 82 are grinded, and hence at the interface between encapsulant 82 and dielectric layer 84A, there are partial particles 82B'.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. In the formation of the packages, a plurality of probing processes may be performed to test device dies, so that the bonded device dies are known-good-dies. The manufacturing yield is thus improved, and accordingly, manufacturing cost is reduced. The package formed in accordance with the embodiments may include probe pads (with possibly solder regions included) in contact with an encapsulant. Also, an InFO process is performed to form an interconnect structure on a die stack including two or more dies stacked through bonding. Accordingly, the InFO interconnect structure may replace the conventional package substrate. Since InFO process is used, no solder region is used between the InFO interconnect structure and the die stack. Rather, the RDLs in the InFO interconnect structure are in direct contact with the electrical connectors of the die stack.

In accordance with some embodiments of the present disclosure, a method comprises bonding a first device die to a second device die; encapsulating the first device die in a first encapsulant; performing a backside grinding process on the second device die to reveal through-vias in the second device die; forming first electrical connectors on the second device die to form a first package, wherein the first package comprises the first device die and the second device die; encapsulating the first package in a second encapsulant; and forming an interconnect structure overlapping the first package and the second encapsulant, wherein the interconnect structure comprises second electrical connectors. In an embodiment, the forming the interconnect structure comprises: forming a dielectric layer overlapping the first package and the second encapsulant; forming openings in the dielectric layer, wherein the first electric connectors are revealed through the openings; and forming redistribution lines extending into the openings to contact the through-vias. In an embodiment, the second device die comprises a plurality of probe pads, and the method further comprises testing the second device die using the plurality of probe pads, and wherein the first encapsulant is in physical contact with the probe pads. In an embodiment, the method further comprises, before the testing, forming solder regions on the plurality of probe pads; and after the testing and before the first device die is bonded to the second device die, removing the solder regions. In an embodiment, the method further comprises, before the testing, forming solder regions on the plurality of probe pads, wherein the testing is performed by contacting probe pins on the solder regions, and wherein after the first device die is encapsulated in the first encapsulant, the solder regions are in physical contact with the first encapsulant. In an embodiment, the second encapsulant fills spaces between the first electrical connectors, and the encapsulating the first package in the second encapsulant comprises a planarization process to level surfaces of the first electrical connectors with a surface of the second encapsulant. In an embodiment, the method further comprises dispensing a filling dielectric material into spaces between the first electrical connectors, and the encapsulating the first package in the second encapsulant comprises a planarization process to level surfaces of the first electrical connectors with a surface of the filling dielectric material. In an embodiment, the method further comprises sawing-through the second encapsulant and the interconnect structure to form a second package, wherein the second package comprises the first device die and the second device die; and bonding the second package to a package substrate.

In accordance with some embodiments of the present disclosure, a structure comprises a package, which comprises a first die and a second die. The first die comprises a first plurality of bonding pads. The second die comprises a second plurality of bonding pads bonding to the first plurality of bonding pads; a semiconductor substrate underlying the second plurality of bonding pads; a plurality of through-vias penetrating through the semiconductor substrate; and first electrical connectors underlying and connecting to the plurality of through-vias. The package further comprises a first encapsulant encapsulating the first die therein. The structure further comprises a second encapsulant encapsulating the package therein; and an interconnect structure underlying the package. The interconnect structure comprises a dielectric layer underlying and contacting both of the second encapsulant and the package; and a plurality of redistribution lines extending into the dielectric layer to contact the first electrical connectors. In an embodiment, the plurality of redistribution lines are formed of non-solder materials. In an embodiment, a portion of the plurality of redistribution lines is directly underlying the second encapsulant. In an embodiment, the first encapsulant and the second encapsulant have a distinguishable interface. In an embodiment, the second die further comprises probe pads, and wherein all sidewalls and top surfaces of the probe pads are in contact with the first encapsulant. In an embodiment, the second die further comprises: a plurality of probe pads; and a plurality of solder regions over and contacting the plurality of probe pads, wherein all sidewalls and top surfaces of the plurality of solder regions are in contact with the first encapsulant. In an embodiment, the structure further comprises a package substrate underlying the interconnect structure; and solder regions physically bonding the interconnect structure to the package substrate.

In accordance with some embodiments of the present disclosure, a structure comprises a package, which comprises a device die including a semiconductor substrate; a package component over and bonding to the device die; a first molding compound molding the package component therein; a dielectric layer underlying the device die, wherein edges of the dielectric layer are flush with corresponding edges of the first molding compound and the device die; and non-solder conductive features underlying the semiconductor substrate of the device die, wherein the non-solder conductive features extend into the dielectric layer. The structure further comprises a plurality of redistribution lines underlying and physically contacting the non-solder conductive features, wherein the plurality of redistribution lines are distributed in an area laterally extending beyond corresponding first edges of the package. In an embodiment, the structure further comprises a second molding compound encircling the package; and a plurality of dielectric layers, wherein the plurality of redistribution lines extend into the plurality of dielectric layers, and wherein second edges of the second molding compound are flushed with corresponding third edges of the plurality of dielectric layers. In an embodiment, the second molding compound comprises a portion directly underlying the dielectric layer, and the second molding compound is in physical contact with the non-solder conductive features. In an embodiment, the structure further comprises a polymer layer in the package and encapsulating the non-solder conductive features therein, wherein additional edges of the polymer layer are flush with the corresponding edges of the first molding compound and corresponding fourth edges of the device die. In an embodiment, the device die comprises electrical conductive features, and wherein the electrical conductive features comprise top surfaces and sidewalls contacting the first molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
a package comprising:
a first die comprising a first plurality of bonding pads;
a second die comprising:
a second plurality of bonding pads bonding to the first plurality of bonding pads;
a semiconductor substrate underlying the second plurality of bonding pads;
a plurality of through-vias penetrating through the semiconductor substrate;
first electrical connectors underlying and connecting to the plurality of through-vias; and
probe pads; and
a first encapsulant encapsulating the first die therein, wherein all sidewalls and top surfaces of the probe pads are in contact with the first encapsulant;
a second encapsulant encapsulating the package therein; and
an interconnect structure underlying the package, wherein the interconnect structure comprises:
a dielectric layer underlying and contacting both of the second encapsulant and the package; and
a plurality of redistribution lines extending into the dielectric layer to contact the first electrical connectors.

2. The structure of claim 1, wherein the plurality of redistribution lines are formed of non-solder materials.

3. The structure of claim 1, wherein a portion of the plurality of redistribution lines is directly underlying the second encapsulant.

4. The structure of claim 1, wherein the first encapsulant and the second encapsulant have a distinguishable interface.

5. The structure of claim 1 further comprising:
a package substrate underlying the interconnect structure; and
solder regions physically bonding the interconnect structure to the package substrate.

6. The structure of claim 1, wherein the probe pads comprise copper.

7. The structure of claim 1, wherein first top surfaces of the second plurality of bonding pads are coplanar with second top surfaces of the probe pads.

8. A structure comprising:
a package comprising:
a device die comprising:
a semiconductor substrate;
a probe pad; and
a solder region over and contacting the probe pad;
a package component over and bonding to the device die;
a first molding compound molding the package component therein, wherein all sidewalls and an entire top surface of the solder region are in direct contact with the first molding compound;
a dielectric layer underlying the device die, wherein edges of the dielectric layer are flush with corresponding edges of the first molding compound and the device die; and
non-solder conductive features underlying the semiconductor substrate of the device die, wherein the non-solder conductive features extend into the dielectric layer; and
a plurality of redistribution lines underlying and physically contacting the non-solder conductive features, wherein the plurality of redistribution lines are distributed in an area laterally extending beyond corresponding first edges of the package.

9. The structure of claim 8 further comprising:
a second molding compound encircling the package; and
a plurality of dielectric layers, wherein the plurality of redistribution lines extend into the plurality of dielectric layers, and wherein second edges of the second molding compound are flush with corresponding third edges of the plurality of dielectric layers.

10. The structure of claim 9, wherein the second molding compound comprises a portion directly underlying the dielectric layer, and the second molding compound is in physical contact with the non-solder conductive features.

11. The structure of claim 8 further comprising a polymer layer in the package and encapsulating the non-solder conductive features therein, wherein additional edges of the polymer layer are flush with the corresponding edges of the first molding compound and corresponding fourth edges of the device die.

12. The structure of claim 8, wherein the device die comprises electrical conductive features, and wherein the electrical conductive features comprise top surfaces and sidewalls contacting the first molding compound.

13. The structure of claim 8, wherein the plurality of redistribution lines comprise:
via portions physically contacting the non-solder conductive features; and
trace portions joined to respective ones of the vias portions, wherein the trace portions are underlying the via portions.

14. The structure of claim 8, wherein the non-solder conductive features comprise metal pillars.

15. The structure of claim 8, wherein the probe pad comprises copper.

16. The structure of claim 8, wherein the dielectric layer comprises a polymer.

17. A structure comprising:
a first device die comprising:
a semiconductor substrate;
a first plurality of electrical connectors over the semiconductor substrate; and
a second plurality of electrical connectors over the semiconductor substrate, wherein both of a first one and a second one of the second plurality of electrical connectors comprises:
a metal pillar; and
a solder region over the metal pillar;
a second device die over and bonding to the first device die through the first plurality of electrical connectors; and
a first molding compound molding the second device die and the second plurality of electrical connectors therein, wherein the second plurality of electrical connectors are overlapped by, and are in physical contact with, the first molding compound molding, wherein an entire top surface of the solder region is in contact with the first molding compound.

18. The structure of claim 17, wherein edges of the first molding compound are flush with corresponding edge of the first device die, and the structure further comprises a second molding compound molding the first molding compound and the first device die therein.

19. The structure of claim 18, wherein the second molding compound extends directly underlying, and contacting a bottom surface of, the first device die.

20. The structure of claim 17, wherein the second plurality of electrical connectors are located on opposite sides of the first plurality of electrical connectors.

* * * * *